US012695474B2

(12) United States Patent
Tanaka

(10) Patent No.: US 12,695,474 B2
(45) Date of Patent: Jul. 28, 2026

(54) RADIO-FREQUENCY MODULE AND COMMUNICATION DEVICE

(71) Applicant: Murata Manufacturing Co., Ltd.,
Nagaokakyo (JP)

(72) Inventor: Rui Tanaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 284 days.

(21) Appl. No.: 18/656,621

(22) Filed: May 7, 2024

(65) Prior Publication Data

US 2024/0291510 A1　Aug. 29, 2024

Related U.S. Application Data

(63) Continuation of application No. PCT/JP2022/044135, filed on Nov. 30, 2022.

(30) Foreign Application Priority Data

Dec. 24, 2021　(JP) ................................ 2021-211580

(51) Int. Cl.
*H04B 1/10* (2006.01)
*H05K 1/02* (2006.01)
(52) U.S. Cl.
CPC ............. *H04B 1/10* (2013.01); *H05K 1/0243* (2013.01); *H05K 2201/1006* (2013.01)
(58) Field of Classification Search
CPC ... H04B 1/10; H04B 1/00; H04B 1/38; H05K 1/0243; H03F 3/19; H03H 7/46; H10W 90/00
See application file for complete search history.

(56) References Cited

U.S. PATENT DOCUMENTS

2016/0126987 A1　5/2016　Wloczysiak

FOREIGN PATENT DOCUMENTS

| JP | 2017-098632 A | 6/2017 |
| JP | 2021-061577 A | 4/2021 |
| WO | 2020/054284 A1 | 3/2020 |
| WO | 2021/100246 A1 | 5/2021 |
| WO | 2021/124691 A1 | 6/2021 |

OTHER PUBLICATIONS

International Search Report and Written Opinion mailed on Feb. 7, 2023, received for PCT Application PCT/JP2022/044135, filed on Nov. 30, 2022, 9 pages including English Translation.

*Primary Examiner* — Timothy J Thompson
*Assistant Examiner* — Aditya Sharma
(74) *Attorney, Agent, or Firm* — XSENSUS LLP

(57) ABSTRACT

A device that includes plurality of inductors, to include two or more first inductors connected to two or more receive filters corresponding to two or more communication bands included in the first combination among a plurality of receive filters, and two or more second inductors connected to two or more receive filters corresponding to two or more communication bands included in the second combination among a plurality of receive filters. In plan view in a thickness direction of a mounting board, at least one second inductor among the two or more second inductors is positioned between two first inductors among the two or more first inductors.

20 Claims, 19 Drawing Sheets

RADIO-FREQUENCY MODULE AND COMMUNICATION DEVICE

CROSS-REFERENCE TO RELATED APPLICATIONS

This is a continuation application of PCT/JP2022/044135, filed on Nov. 30, 2022, designating the United States of America, which is based on and claims priority to Japanese Patent Application No. JP 2021-211580 filed on Dec. 24, 2021. The entire contents of the above-identified applications, including the specifications, drawings and claims, are incorporated herein by reference in their entirety.

TECHNICAL FIELD

The present disclosure generally relates to a radio-frequency module and a communication device, and more specifically relates to a radio-frequency module including a plurality of low-noise amplifier and a communication device including the radio-frequency module.

BACKGROUND ART

Patent Document 1 discloses a radio-frequency module including a package substrate (mounting board), a plurality of filters (receive filters) corresponding to a plurality of frequency bands (communication bands), a plurality of low-noise amplifiers, and a plurality of impedance matching components connected between the plurality of low-noise amplifiers and the plurality of filters. Patent Document 1 discloses that each of the plurality of impedance matching components can include an inductor. The radio-frequency module disclosed in Patent Document 1 is capable of supporting carrier aggregation.

CITATION LIST

Patent Document

Patent Document 1: United States Patent Application Publication No. 2016/0126987

SUMMARY OF DISCLOSURE

Technical Problem

For example, when a radio-frequency module of the related art includes two or more receive filters and two or more inductors used during simultaneous communication such as carrier aggregation, characteristics during simultaneous communication may deteriorate due to magnetic field coupling/electric field coupling of two or more inductors. An object of the present disclosure is to provide a radio-frequency module and a communication device which can suppress deterioration in characteristics during simultaneous communication.

Solution to Problem

A radio-frequency module according to one aspect of the present disclosure includes a mounting board, a plurality of receive filters, a plurality of low-noise amplifiers, and a plurality of inductors. The mounting board has a first main surface and a second main surface facing each other. The plurality of receive filters are disposed on the mounting board. The plurality of receive filters correspond to a plurality of communication bands. The plurality of low-noise amplifiers are disposed on the mounting board. Each of the plurality of low-noise amplifier has an input terminal and an output terminal. The plurality of inductors are disposed on the first main surface of the mounting board. The plurality of inductors are connected between the input terminal of the plurality of low-noise amplifiers and the plurality of receive filters. The plurality of communication bands include two or more communication bands included in a first combination of communication bands capable of simultaneous communication and two or more communication bands included in a second combination of communication bands capable of simultaneous communication. The plurality of inductors include two or more first inductors connected to two or more receive filters corresponding to the two or more communication bands included in the first combination among the plurality of receive filters, and two or more second inductors connected to two or more receive filters corresponding to the two or more communication bands included in the second combination among the plurality of receive filters. At least one second inductor among the two or more second inductors is positioned between two first inductors among the two or more first inductors in plan view in a thickness direction of the mounting board.

A radio-frequency module according to another aspect of the present disclosure includes a mounting board, a plurality of receive filters, a plurality of low-noise amplifiers, and a plurality of inductors. The mounting board has a first main surface and a second main surface facing each other. The plurality of receive filters are disposed on the mounting board. The plurality of receive filters correspond to a plurality of communication bands. The plurality of low-noise amplifiers are disposed on the mounting board. Each of the plurality of low-noise amplifier has an input terminal and an output terminal. The plurality of inductors are disposed on the first main surface of the mounting board. The plurality of inductors are connected between the input terminal of the plurality of low-noise amplifiers and the plurality of receive filters. The plurality of communication bands include two or more communication bands corresponding to the combination of the communication bands capable of simultaneous communication. The plurality of inductors include two or more inductors connected to two or more receive filters corresponding to the two or more communication bands among the plurality of receive filters. The two or more inductors include a first inductor and a second inductor. The first inductor has a first winding portion. The second inductor has a second winding portion. The second inductor is adjacent to the first inductor in plan view in a thickness direction of the mounting board. A winding axis of the first winding portion of the first inductor does not intersect with the second inductor.

According to still another aspect of the present disclosure, a communication device includes the radio-frequency module according to the above-described aspect, and a signal processing circuit. The signal processing circuit is connected to the radio-frequency module.

Advantageous Effects of Disclosure

According to the above aspect of the present disclosure, the radio-frequency module and the communication device can suppress deterioration in characteristics during simultaneous communication.

DESCRIPTION OF EMBODIMENTS

Figure 1:
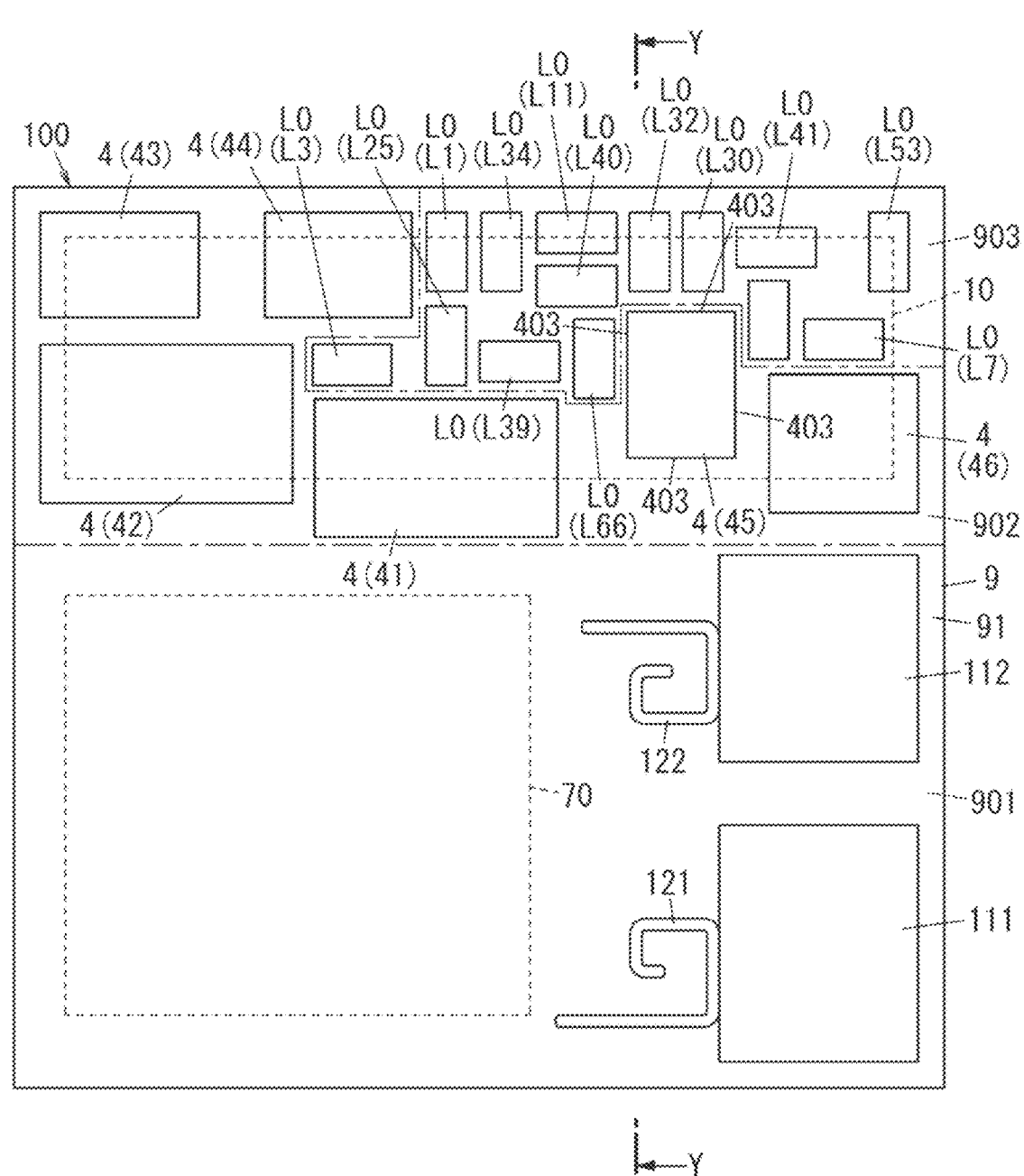
FIG. 1 is a plan view of a radio-frequency module according to Embodiment 1.

FIGS. 1 to 6 and 15A to 20, which are referred to in the following embodiments or the like, are all schematic views, and each of ratios of sizes or thicknesses of each constituent element in the drawing does not necessarily reflect the actual dimensional ratio.

Embodiment 1

(1) Overview

Figure 2:
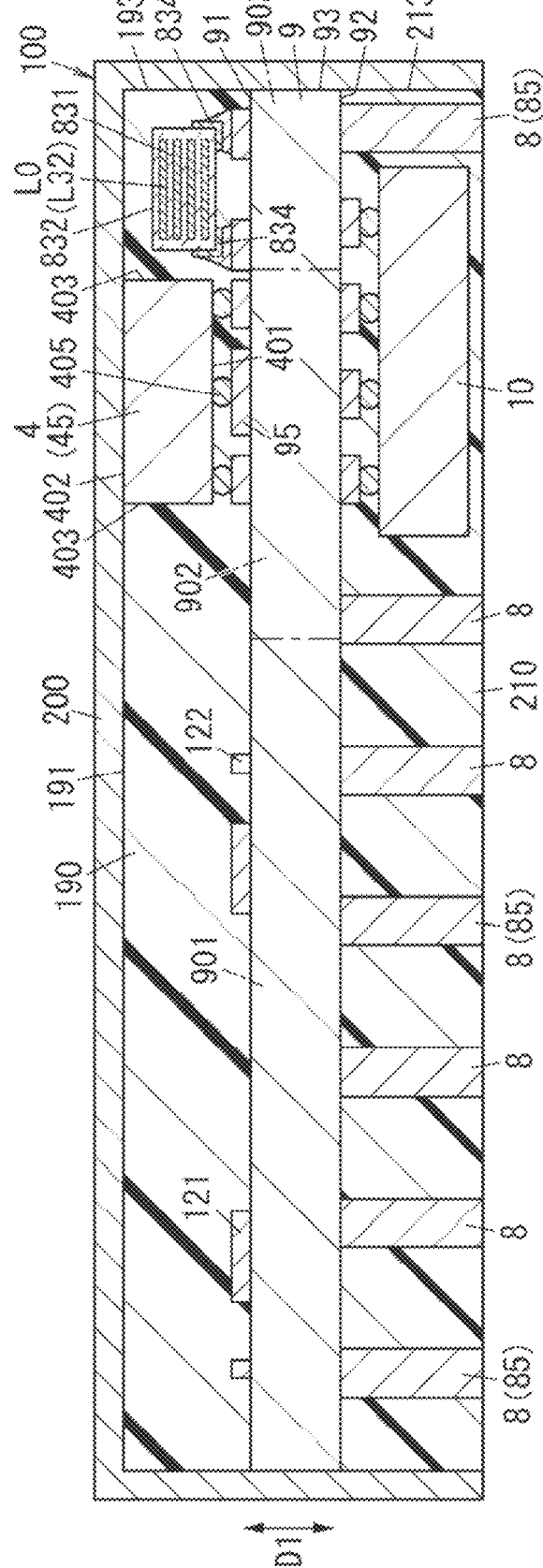
FIG. 2 is a sectional view of the above radio-frequency module taken along line Y-Y in FIG. 1.

As shown in FIGS. 1 and 2, a radio-frequency module 100 according to Embodiment 1 includes a mounting board 9, a plurality of (for example, 13) receive filters F0 (refer to FIG. 7), a plurality of (for example, 13) low-noise amplifiers A0

Figure 7:
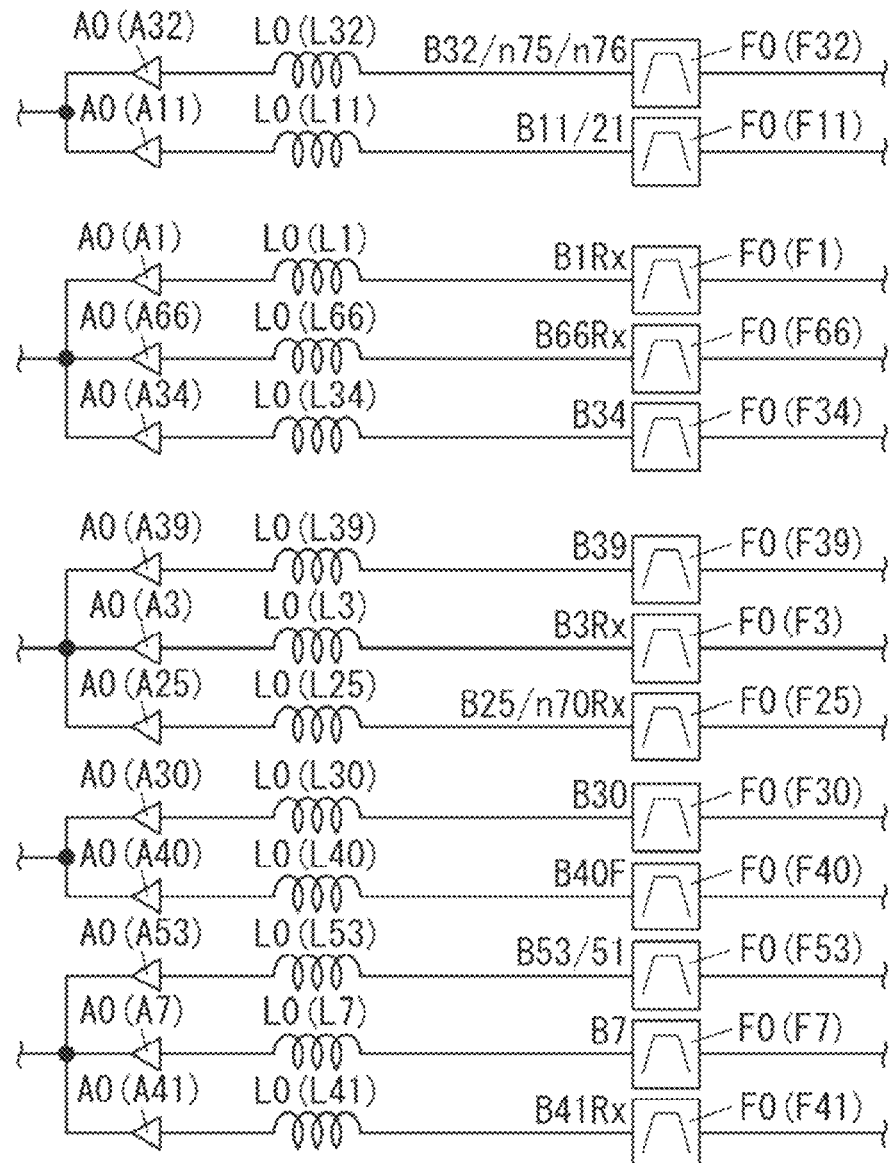
FIG. 7 is a main portion circuit diagram showing a relationship between a plurality of low-noise amplifiers, a plurality of receive filters, and a plurality of inductors in the above radio-frequency module.

(refer to FIG. 7) and a plurality of (for example, 13) inductors L0. The mounting board 9 has a first main surface 91 and a second main surface 92 (refer to FIG. 2) facing each other. Here, "facing" means facing geometrically rather than physically. In the radio-frequency module 100, an IC chip 10 including the plurality of low-noise amplifiers A0 is disposed on the second main surface 92 of the mounting board 9. Each of the plurality of low-noise amplifiers A0 has an input terminal and an output terminal. The plurality of inductors L0 are disposed on the first main surface 91 of the mounting board 9. As shown in FIG. 7, the plurality of inductors L0 are connected to the input terminals of the plurality of low-noise amplifiers A0. The "radio-frequency module" as used in the present specification is a module used for communication of radio-frequency signals. The plurality of receive filters F0 correspond to a plurality of communication bands.

Figure 8:
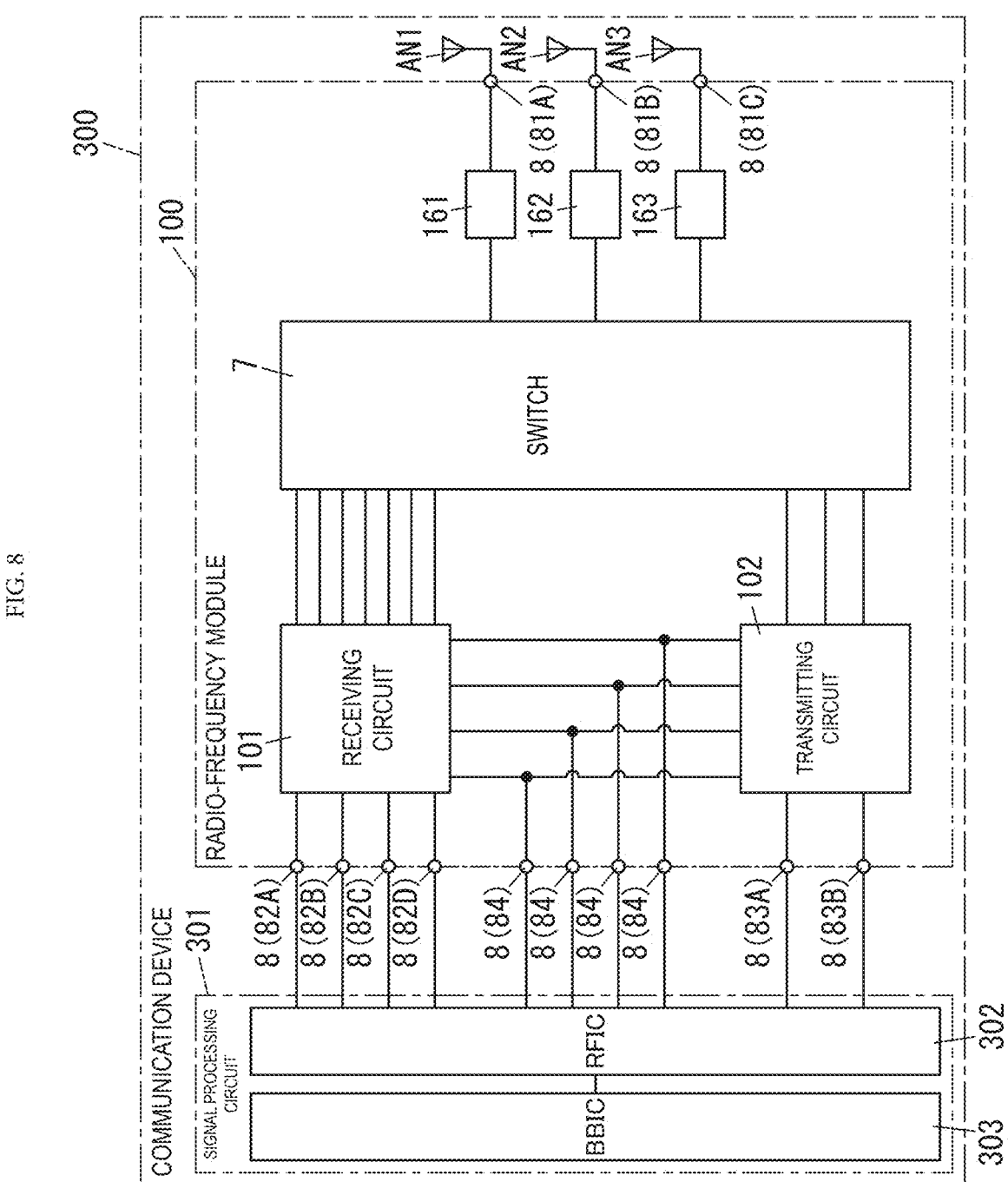
FIG. 8 is a circuit block diagram of a communication device including the above radio-frequency module.
Figure 9:
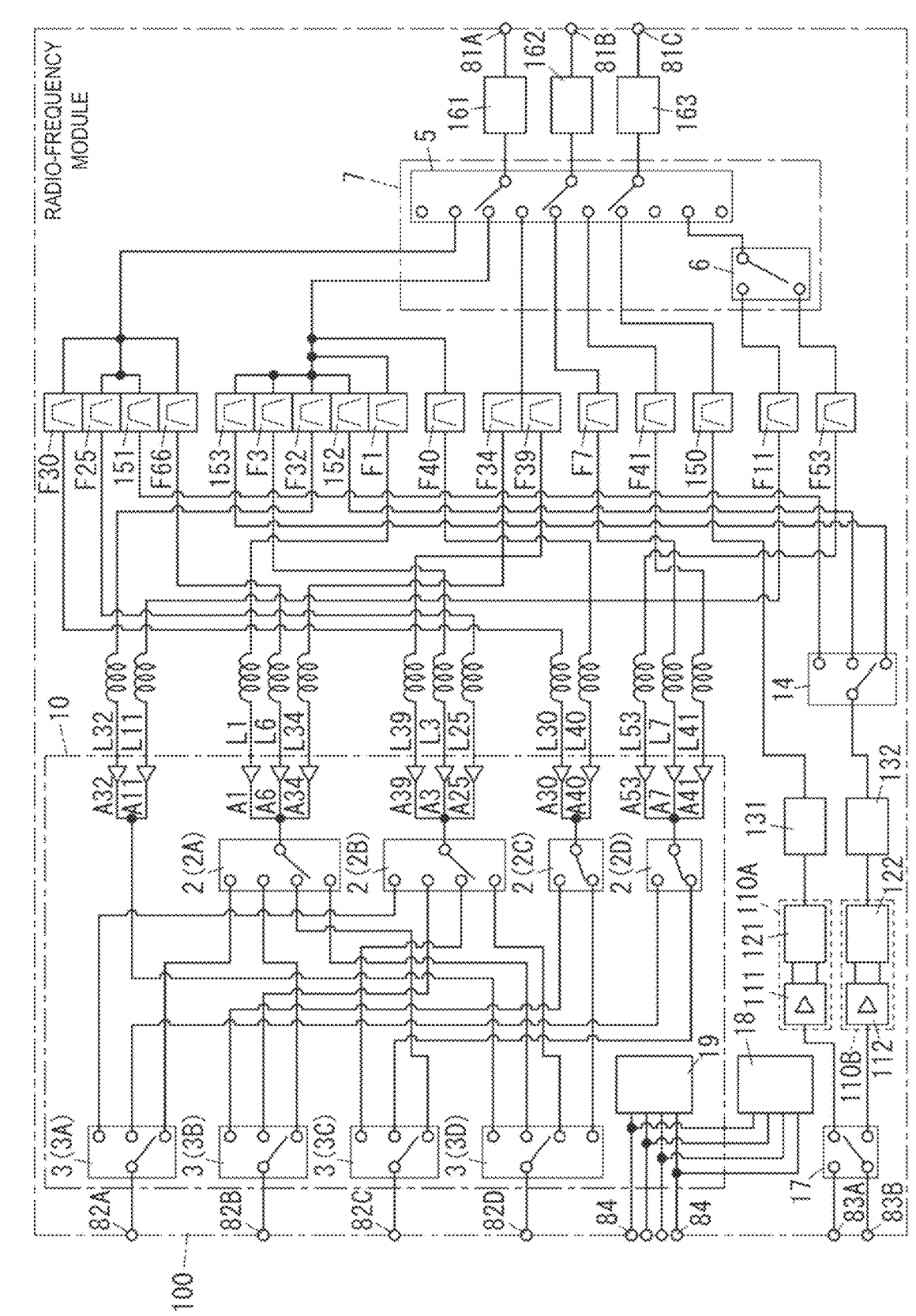
FIG. 9 is a circuit configuration diagram of the above radio-frequency module.

The radio-frequency module 100 is used, for example, in a communication device 300 as shown in FIGS. 8 and 9. The communication device 300 is, for example, a mobile phone (for example, a smartphone), but is not limited thereto, and may be, for example, a wearable terminal (for example, a smartwatch), or the like. The radio-frequency module 100 is, for example, a module that can support a fourth generation mobile communication (4G) standard or a fifth generation mobile communication (5G) standard. The 4G standard is, for example, a third generation partnership project (3GPP) (registered trademark) long term evolution (LTE) standard (registered trademark). The 5G standard is, for example, 5G new radio (NR). The radio-frequency module 100 is, for example, a module capable of supporting carrier aggregation and dual connectivity. Further, the radio-frequency module 100 is capable of supporting multi input multi output (MIMO).

Each of the plurality of receive filters F0 is connected to one low-noise amplifier A0 among the plurality of low-noise amplifiers A0 with one inductor L0 interposed therebetween among the plurality of inductors L0. In the radio-frequency module 100, the pass bands of the plurality of receive filters F0 correspond to the plurality of communication bands. Each of the plurality of communication bands is, for example, a communication band used for communication corresponding to frequency division duplex (FDD) as a communication method, a communication band used for communication corresponding to time division duplex (TDD), or communication band used for communication corresponding to supplemental downlink (SDL). The plurality of communication bands include, for example, Band 32, Band 11, Band 1, Band 66, Band 34, Band 39, Band 3, Band 25, Band 30, Band 40, Band 53, Band 7, and Band 41 of the 3GPP LTE standard.

In FIG. 7, a receive filter F0 (hereinafter also referred to as a receive filter F32) having pass bands corresponding to the receive band of Band 32 of the 3GPP LTE standard, the receive band of n75 of the 5G NR standard, and the receive band of n76 of the 5G NR standard is written as "B32/n75/n76" on the left side of the graphical symbol. Similarly, in FIG. 7, "B11/21" is written on the left side of the graphical symbol of the receive filter F0 (hereinafter also referred to as a receive filter F11) having a pass band corresponding to the receive band of Band 11 and the receive band of Band 21. Similarly, in FIG. 7, "B1Rx" is written on the left side of the graphical symbol of the receive filter F0 (hereinafter also referred to as a receive filter F1) having a pass band corresponding to the receive band of Band 1. Similarly, in FIG. 7, "B66Rx" is written on the left side of the graphical symbol of the receive filter F0 (also referred to as a receive filter F66) having a pass band corresponding to the receive band of Band 66. Similarly, in FIG. 7, "B34" is written on the left side of the graphical symbol of the receive filter F0 (hereinafter also referred to as a receive filter F34) having a pass band corresponding to the receive band of Band 34. Similarly, in FIG. 7, "B39" is written on the left side of the graphical symbol of the receive filter F0 (hereinafter also referred to as a receive filter F39) having a pass band corresponding to the receive band of Band 39. Similarly, in FIG. 7, "B3Rx" is written on the left side of the graphical symbol of the receive filter F0 (hereinafter also referred to as a receive filter F3) having a pass band corresponding to the receive band of Band 3. Similarly, in FIG. 7, "B25/ n70Rx" is written on the left side of the graphical symbol of the receive filter F0 (hereinafter also referred to as a receive filter F25) having a pass band corresponding to the receive band of Band 25 and the receive band of n70. Similarly, in FIG. 7, "B30" is written on the left side of the graphical symbol of the receive filter F0 (hereinafter also referred to as a receive filter F30) having a pass band corresponding to the receive band of Band 30. Similarly, in FIG. 7, "B40F" is written on the left side of the graphical symbol of the receive filter F0 (hereinafter also referred to as a receive filter F40) having a pass band corresponding to the receive band of Band 40. Similarly, in FIG. 7, "B53/51" is written on the left side of the graphical symbol of the receive filter F0 (hereinafter also referred to as a receive filter F53) having a pass band corresponding to the receive band of Band 53 and the receive band of Band 51. Similarly, in FIG. 7, "B7" is written on the left side of the graphical symbol of the receive filter F0 (hereinafter also referred to as a receive filter F7) having a pass band corresponding to the receive band of Band 7. Similarly, in FIG. 7, "B41Rx" is written on the left side of the graphical symbol of the receive filter F0 (hereinafter also referred to as a receive filter F41) having a pass band corresponding to the receive band of Band 41.

Hereinafter, the plurality of inductors L0 connected to the plurality of receive filters F32, F11, F1, F66, F34, F39, F3, F25, F30, F40, F53, F7, and F41 on a one-to-one basis are respectively referred to as inductors L32, L11, L1, L66, L34, L39, L3, L25, L30, L40, L53, L7, and L41. Similarly, the plurality of low-noise amplifiers A0 connected to the plurality of receive filters F32, F11, F1, F66, F34, F39, F3, F25, F30, F40, F53, F7, and F41 with the inductors L32, L11, L1, L66, L34, L39, L3, L25, L30, L40, L53, L7, and L41 interposed therebetween, respectively, are respectively referred to as low-noise amplifiers A32, A11, A1, A66, A34, A39, A3, A25, A30, A40, A53, A7, and A41.

The plurality of communication bands include two or more communication bands included in a first combination of communication bands capable of simultaneous communication and two or more communication bands included in a second combination of communication bands capable of simultaneous communication. Further, the plurality of communication bands include two or more communication bands included in a third combination of communication bands capable of simultaneous communication. Here, "capable of simultaneous communication" means that simultaneous reception is possible. In the radio-frequency module 100 according to Embodiment 1, when not limited to the plurality of communication bands, "capable of simultaneous communication" means that at least one of simultaneous reception, simultaneous transmission, and simultaneous transmission and reception is possible. For example, when two or more communication bands included in the first combination include two or more communication bands included in a combination of carrier aggregations supported by a European communication carrier, the two or more communication bands that are included in the second combination include, for example, two or more communication bands included in a combination of carrier aggregations supported by a communication carrier of the People's Republic of China. In addition, for example, when two or more communication bands included in the first combination include two or more communication bands included in a combination of carrier aggregations supported by a communication carrier in the United States, the two or more communication bands that are included in the second combination include, for example, two or more communication bands included in a combination of carrier aggregations supported by a communication carrier of the People's Republic of China. Europe is one of the regions included in a first region classified by the Radio Regulations (RR), which are international rules related to radio communication, in the ITU Radio communication Sector (ITU-R) of the International Telecommunication Union (ITU). In addition, the United States is one of the regions included in a second region classified in the above-described Radio Regulations. In addition, the People's Republic of China is one of the regions included in a third region classified in the above-described Radio Regulations. The two or more communication bands included in the combination of carrier aggregations supported by the European communication carrier include, for example, Band 1, Band 3, Band 40, Band 32, and Band 7 of the 3GPP LTE standard. In addition, the two or more communication bands included in the combination of carrier aggregations supported by the European communication carrier include, for example, Band 1, Band 3, Band 40, Band 32, and Band 41 of the 3GPP LTE standard. The two or more communication bands included in the combination of carrier aggregations supported by the communication carriers of the People's Republic of China include, for example, Band 34, Band 39, and Band 41 of the 3GPP LTE standard. The two or more communication bands included in the combination of carrier aggregations supported by the communication carrier in the United States include, for example, Band 25, Band 66, Band 30, and Band 7 of the 3GPP LTE standard. In addition, the two or more communication bands included in the combination of carrier aggregations supported by the communication carrier in the United States include, for example, Band 25, Band 66, Band 30, and Band 7 of the 3GPP LTE standard.

Hereinafter, the radio-frequency module 100 according to Embodiment 1 will be described with reference to FIGS. 1 to 12, and the communication device 300 will be described in more detail with reference to FIGS. 8 to 12.

(2) Radio-Frequency Module (2.1) Circuit Configuration of Radio-Frequency Module The circuit configuration of the radio-frequency module 100 according to Embodiment 1 will be described with reference to FIGS. 8 to 12.

The radio-frequency module 100 is configured, for example, such that reception signals input from three antennas AN1, AN2, and AN3 can be amplified and output to a signal processing circuit 301. Further, the radio-frequency module 100 is configured, for example, such that a transmission signal input from the signal processing circuit 301 can be amplified and output to the two antennas AN1 and AN3. The signal processing circuit 301 is not a constituent element of the radio-frequency module 100, but a constituent element of the communication device 300 including the radio-frequency module 100. The radio-frequency module 100 according to Embodiment 1 is controlled by, for example, the signal processing circuit 301 of the communication device 300. The communication device 300 includes the radio-frequency module 100 and the signal processing circuit 301. The communication device 300 further includes three antennas AN1, AN2, and AN3. The communication device 300 further includes a circuit board on which the radio-frequency module 100 is mounted. The circuit board is, for example, a printed wiring board. The circuit board has a ground electrode to which a ground potential is applied.

As shown in FIG. 8, the radio-frequency module 100 includes a receiving circuit 101, a transmitting circuit 102, a plurality of external connection terminals 8, a switch 7, and three matching circuits 161, 162, and 163.

The receiving circuit 101 includes the plurality of (for example, 13) low-noise amplifiers A0 (refer to FIG. 7), the plurality of (for example, 13) inductors L0 (refer to FIG. 7), the plurality of (for example, 13) receive filters F0 (refer to FIG. 7), a plurality of (for example, 4) first switches 2 (refer to FIG. 9), and a plurality of (for example, 4) second switches 3 (refer to FIG. 9). In the receiving circuit 101, each of the plurality of inductors L0 is a circuit element of an input matching circuit for matching the impedance of the low-noise amplifier A0 connected to one end of the inductor L0 and the receive filter F0.

As shown in FIG. 9, the transmitting circuit 102 includes a plurality of (for example, 2) power amplifiers 110A and 110B, a plurality of (for example, 4) transmission filters 150 to 153, a plurality of (for example, 2) output matching circuits 131 and 132, a switch 17, and a switch 14.

As shown in FIGS. 8 and 9, the plurality of external connection terminals 8 include three antenna terminals 81A, 81B, and 81C, four signal output terminals 82A, 82B, 82C, and 82D, two signal input terminals 83A and 83B, and four control terminals 84, and a plurality of ground terminals 85 (refer to FIG. 2). The four signal output terminals 82A, 82B, 82C, and 82D are terminals for outputting the radio-frequency signals (reception signals) from the receiving circuit 101 to an external circuit (for example, a signal processing circuit 301). Two signal input terminals 83A and 83B are terminals for inputting radio-frequency signals (transmission signals) from an external circuit (for example, the signal processing circuit 301) to the radio-frequency module 100. The plurality of control terminals 84 are terminals for inputting control signals (digital signals) from an external circuit (for example, the signal processing circuit 301) to, for example, the receiving circuit 101, the transmitting circuit 102, and the switch 7. The plurality of ground terminals 85 are terminals to which a ground potential is applied.

The switch 7 includes a first switch circuit 5 as shown in FIG. 9. Further, the switch 7 further includes a second switch circuit 6. The first switch circuit 5 is configured to switch the connection relationship between the plurality of receive filters F0 of the receiving circuit 101 and the three antennas AN1, AN2, and AN3. Further, the switch 7 is configured to further include the second switch circuit 6 to switch connection relationship between the four transmission filters 150 to 153 of the transmitting circuit 102 and the two antennas AN1 and AN3.

Figure 11:
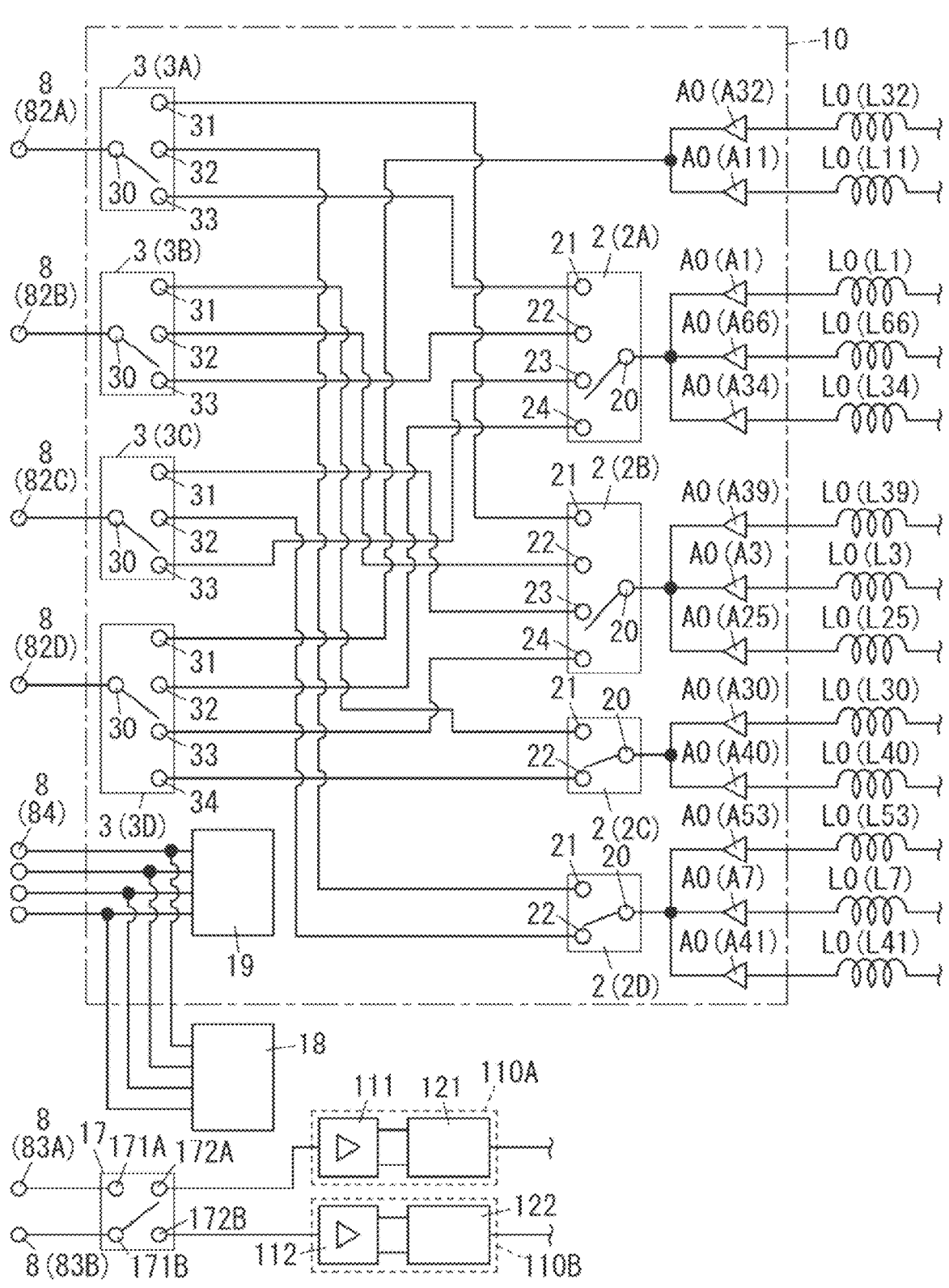
FIG. 11 is a circuit diagram showing a part of a receiving circuit and a part of a transmitting circuit in the above radio-frequency module.

Hereinafter, for convenience of description, the second switch 3 connected to the signal output terminal 82A is referred to as a second switch 3A. Similarly, the second switch 3 connected to the signal output terminal 82B is referred to as a second switch 3B, the second switch 3 connected to the signal output terminal 82C is referred to as the second switch 3C, and the second switch 3 connected to the signal output terminal 82D is referred to as a second switch 3D. As shown in FIG. 11, each of the second switches 3A, 3B, and 3C has a common terminal 30 and a plurality of (for example, 3) selection terminals 31 to 33. In addition, as shown in FIG. 11, the second switch 3D has the common terminal 30 and the plurality of (for example, 4) selection terminals 31 to 34.

In addition, hereinafter, when the plurality of first switches 2 are distinguished, the first switches 2 are also referred to as a first switch 2A, a first switch 2B, a first switch 2C, and a first switch 2D, respectively. As shown in FIG. 11, each of the first switches 2A and 2B has a common terminal 20 and a plurality of (for example, 4) selection terminals 21 to 24. Further, as shown in FIG. 11, each of the first switches 2C and 2D has the common terminal 20 and the plurality of (for example, 2) selection terminals 21 and 22.

Hereinafter, a circuit configuration of the radio-frequency module 100 will be described in more detail.

As shown in FIG. 7, the plurality of receive filters F0 include the plurality of receive filters F32, F11, F1, F66, F34, F39, F3, F25, F30, F40, F53, F7, and F41. The receive filter F32 has pass bands corresponding to the receive band of Band 32 of the 3GPP LTE standard, the receive band of n75 of 5G NR standard, and the receive band of n76 of the 5G NR standard. The receive filter F11 has a pass band corresponding to the receive band of Band 11 and the receive band of Band 21. The receive filter F1 has a pass band corresponding to the receive band of Band 1. The receive filter F66 has a pass band corresponding to the receive band of Band 66. The receive filter F34 has a pass band corresponding to the receive band of Band 34. The receive filter F39 has a pass band corresponding to the receive band of Band 39. The receive filter F3 has a pass band corresponding to the receive band of Band 3. The receive filter F25 has a pass band corresponding to the receive band of Band 25 and the receive band of n70. The receive filter F30 has a pass band corresponding to the receive band of Band 30. The receive filter F40 has a pass band corresponding to the receive band of the Band 40. The receive filter F53 has a pass band corresponding to the receive band of the Band 53 and the receive band of the Band 51. The receive filter F7 has a pass band corresponding to the receive band of Band 7. The receive filter F41 has a pass band corresponding to the receive band of Band 41.

Each of the plurality of low-noise amplifiers A0 has an input terminal and an output terminal. Each of the plurality of low-noise amplifiers A0 amplifies the reception signal input to the input terminal to output the reception signal from the output terminal. As shown in FIG. 7, the plurality of low-noise amplifiers A0 include a plurality of low-noise amplifiers A32, A11, A1, A66, A34, A39, A3, A25, A30, A40, A53, A7, and A41.

The input terminal of the low-noise amplifier A32 is connected to the receive filter F32 with the inductor L32 interposed therebetween. The input terminal of the low-noise amplifier A11 is connected to the receive filter F11 with the inductor L11 interposed therebetween. The low-noise amplifier A1 is connected to the receive filter F1 with the inductor L1 interposed therebetween. The low-noise amplifier A66 is connected to the receive filter F66 with the inductor L66 interposed therebetween. The low-noise amplifier A34 is connected to the receive filter F34 with the inductor L34 interposed therebetween. The low-noise amplifier A39 is connected to the receive filter F39 with the inductor L39 interposed therebetween. The low-noise amplifier A3 is connected to the receive filter F3 with the inductor L3 interposed therebetween. The low-noise amplifier A25 is connected to the receive filter F25 with the inductor L25 interposed therebetween. The low-noise amplifier A30 is connected to the receive filter F30 with the inductor L30 interposed therebetween. The low-noise amplifier A40 is connected to the receive filter F40 with the inductor L40 interposed therebetween. The low-noise amplifier A53 is connected to the receive filter F53 with the inductor L53 interposed therebetween. The low-noise amplifier A7 is connected to the receive filter F7 with the inductor L7 interposed therebetween. The low-noise amplifier A41 is connected to the receive filter F41 with the inductor L41 interposed therebetween.

As shown in FIG. 11, each output terminal of the two low-noise amplifiers A32 and A11 is connected to the selection terminal 31 of the second switch 3D.

Each output terminal of the three low-noise amplifiers A1, A66, and A34 is connected to the common terminal 20 of the first switch 2A. Here, the low-noise amplifiers A1, A66, and A34 respectively correspond to one communication band (Band 1) included in the first combination, one communication band (Band 66) included in the second combination, and one communication band (Band 34) included in the third combination.

Each output terminal of the three low-noise amplifiers A3, A25, and A39 is connected to the common terminal 20 of the first switch 2B. Here, the low-noise amplifiers A3, A25, and A39 respectively correspond to one communication band (Band 3) included in the first combination, one communication band (Band 25) included in the second combination, and one communication band (Band 39) included in the third combination.

Each output terminal of the two low-noise amplifiers A40 and A30 is connected to the common terminal 20 of the first switch 2C. Here, the low-noise amplifiers A40 and A30 correspond to one communication band (Band 40) included in the first combination and one communication band (Band 30) included in the second combination, respectively.

Each output terminal of the three low-noise amplifiers A53, A7, and A41 is connected to the common terminal 20 of the first switch 2D. Here, the low-noise amplifier A7 corresponds to one communication band (Band 7) included in both the first combination and the second combination. Further, the low-noise amplifier A41 corresponds to the communication band (Band 41) included in all of the first combination, the second combination, and the third combination.

The common terminal 20 of the first switch 2A is connected to each of the output terminals of the three low-noise amplifiers A1, A66, and A34. The selection terminal 21 of the first switch 2A is connected to the selection terminal 33 of the second switch 3A. The selection terminal 22 of the first switch 2A is connected to the selection terminal 33 of the second switch 3B. The selection terminal 23 of the first switch 2A is connected to the selection terminal 33 of the second switch 3C. The selection terminal 24 of the first switch 2A is connected to the selection terminal 32 of the second switch 3D.

The common terminal 20 of the first switch 2B is connected to each of the output terminals of the three low-noise amplifiers A3, A25, and A39. The selection terminal 21 of the first switch 2B is connected to the selection terminal 31 of the second switch 3A. The selection terminal 22 of the first switch 2B is connected to the selection terminal 32 of the second switch 3B. The selection terminal 23 of the first switch 2B is connected to the selection terminal 31 of the second switch 3C. The selection terminal 24 of the first switch 2B is connected to the selection terminal 33 of the second switch 3D.

The common terminal 20 of the first switch 2C is connected to each of the output terminals of the two low-noise amplifiers A40 and A30. The selection terminal 21 of the first switch 2C is connected to the selection terminal 31 of the second switch 3B. The selection terminal 22 of the first switch 2C is connected to the selection terminal 34 of the second switch 3D.

The common terminal 20 of the first switch 2D is connected to each output terminal of the three low-noise amplifiers A53, A7, and A41. The selection terminal 21 of the first switch 2D is connected to the selection terminal 32 of the second switch 3A. The selection terminal 22 of the first switch 2D is connected to the selection terminal 32 of the second switch 3C.

The common terminal 30 of the second switch 3A is connected to the signal output terminal 82A. The common terminal 30 of the second switch 3B is connected to the signal output terminal 82B. The common terminal 30 of the second switch 3C is connected to the signal output terminal 82C. The common terminal 30 of the second switch 3D is connected to the signal output terminal 82D.

Each of the plurality of (2) power amplifiers 110A and 110B has an input terminal and an output terminal. Each of the plurality of power amplifiers 110A to 110B amplifies the transmission signal input to the input terminal to output the amplified transmission signal from the output terminal. The input terminal of the power amplifier 110A and the input terminal of the power amplifier 110B are connected to the signal input terminal 83A or the signal input terminal 83B with the switch 17 interposed therebetween. Therefore, as shown in FIGS. 8 and 9, in the communication device 300 including the radio-frequency module 100, the input terminal of the power amplifier 110A and the input terminal of the power amplifier 110B are connected to the signal processing circuit 301 of the communication device 300 with the switch 17 and the signal input terminal 83A or the signal input terminal 83B interposed therebetween. Two signal input terminals 83A and 83B are terminals for inputting radio-frequency signals (transmission signals) from an external circuit (for example, the signal processing circuit 301) to the radio-frequency module 100. As shown in FIG. 11, the switch 17 has two first terminals 171A and 171B and two second terminals 172A and 172B. In the switch 17, each of the two first terminals 171A and 171B is connectable to any of the two second terminals 172A and 172B. In the switch 17, the first terminals 171A and 171B are connected to the signal input terminals 83A and 83B, respectively. Further, in the switch 17, the second terminals 172A and 172B are connected to the input terminal of the power amplifier 110A and the input terminal of the power amplifier 110B, respectively.

Figure 10:
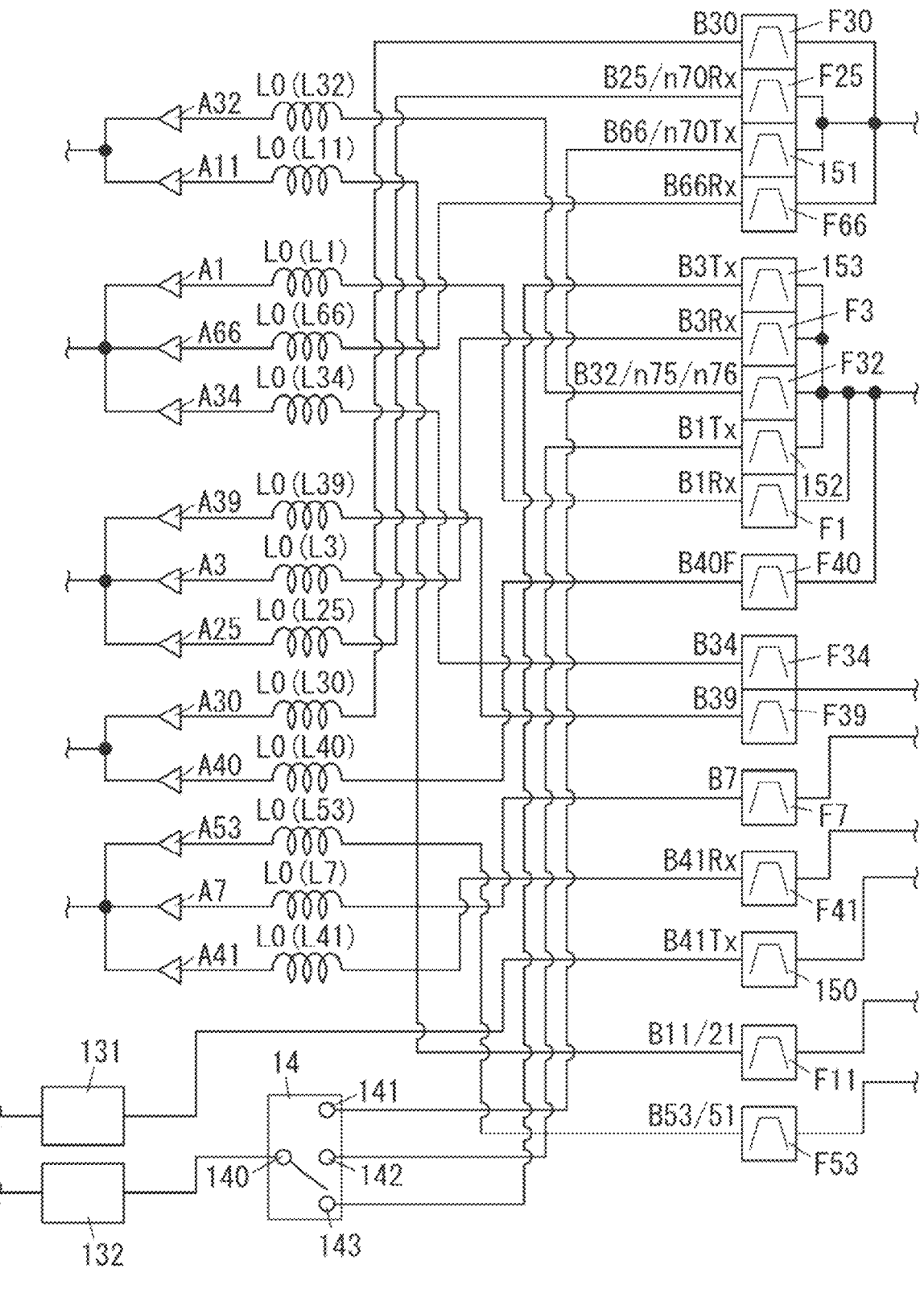
FIG. 10 is a circuit diagram of a receiving circuit and the like of a radio-frequency module in the radio-frequency module.

The power amplifier 110A and the power amplifier 110B power-amplify the radio-frequency signals in the transmission bands of the communication bands different from each other. As shown in FIG. 9, the output terminal of the power amplifier 110A is connected to the first switch circuit 5 with the output matching circuit 131 and the transmission filter 150 interposed therebetween. The transmission filter 150 is, for example, a filter in which a pass band is the transmission band of Band 41 of the 3GPP LTE standard. The output terminal of the power amplifier 110B can be connected to a plurality of (for example, 3) transmission filters 151, 152, and 153 with the output matching circuit 132 and the switch 14 interposed therebetween. Here, as shown in FIG. 10, the switch 14 has a common terminal 140 and three selection terminals 141, 142, and 143 that can be connected to the common terminal 140. In the switch 14, the common terminal 140 is connected to the output matching circuit 132. Further, in the switch 14, the three selection terminals 141, 142, and 143 are connected to the three transmission filters 151, 152, and 153 on a one-to-one basis. The transmission filter 151 has a pass band including, for example, a transmission band of Band 66 of the 3GPP LTE standard and a transmission band of n70 of the 5G NR standard. The transmission filter 152 has a pass band that includes a transmission band of Band 1. The transmission filter 153 has a pass band that includes a transmission band of Band 3. In addition, in FIGS. 10 and 12, "B41Tx" is written to the left side of the graphical symbol of the transmission filter 150. In addition, in FIGS. 10 and 12, "B66/n70Tx", "B1Tx", and "B3Tx" are written on the left side of the graphic symbols of the transmission filters 151, 152, and 153, respectively.

The power amplifier 110A is, for example, a differential synthetic amplifier, and includes an amplifier 111 and a transformer 121 as shown in FIG. 9. The power amplifier 110B is, for example, a differential synthetic amplifier, and includes an amplifier 112 and a transformer 122 as shown in FIG. 9. Each of the two power amplifiers 110A and 110B is not limited to the differential synthetic amplifier, and may be, for example, a Doherty amplifier. As shown in FIGS. 9 and 11, the radio-frequency module 100 further includes a controller 18 that controls the power amplifiers 110A and 110B. The controller 18 controls the power amplifiers 110A and 110B, for example, according to a control signal from the signal processing circuit 301 (refer to FIG. 8). In addition, the controller 18 is connected to the signal processing circuit 301 with the plurality of (for example, 4) control terminals 84 interposed therebetween. The plurality of control terminals 84 are terminals for inputting control signals from an external circuit (for example, the signal processing circuit 301) to the controller 18. The controller 18 controls the power amplifiers 110A and 110B, the switch 17, and the switch 14 based on control signals acquired from the signal processing circuit 301 with the plurality of control terminals 84 interposed therebetween. The control signals acquired by the controller 18 are digital signals.

As shown in FIGS. 9 and 10, the output matching circuit 131 is provided in the signal path between the output terminal of the power amplifier 110A and the transmission filter 150. The output matching circuit 131 is a circuit for impedance matching between the power amplifier 110A and the transmission filter 150, and includes, for example, a plurality of inductors and a plurality of capacitors. Further, the output matching circuit 132 is provided in the signal path between the output terminal of the power amplifier 110B and the switch 14. The output matching circuit 132 is a circuit for impedance matching between the power amplifier 110B and the transmission filters 151 to 153, and includes, for example, a plurality of inductors and a plurality of capacitors.

Figure 12:
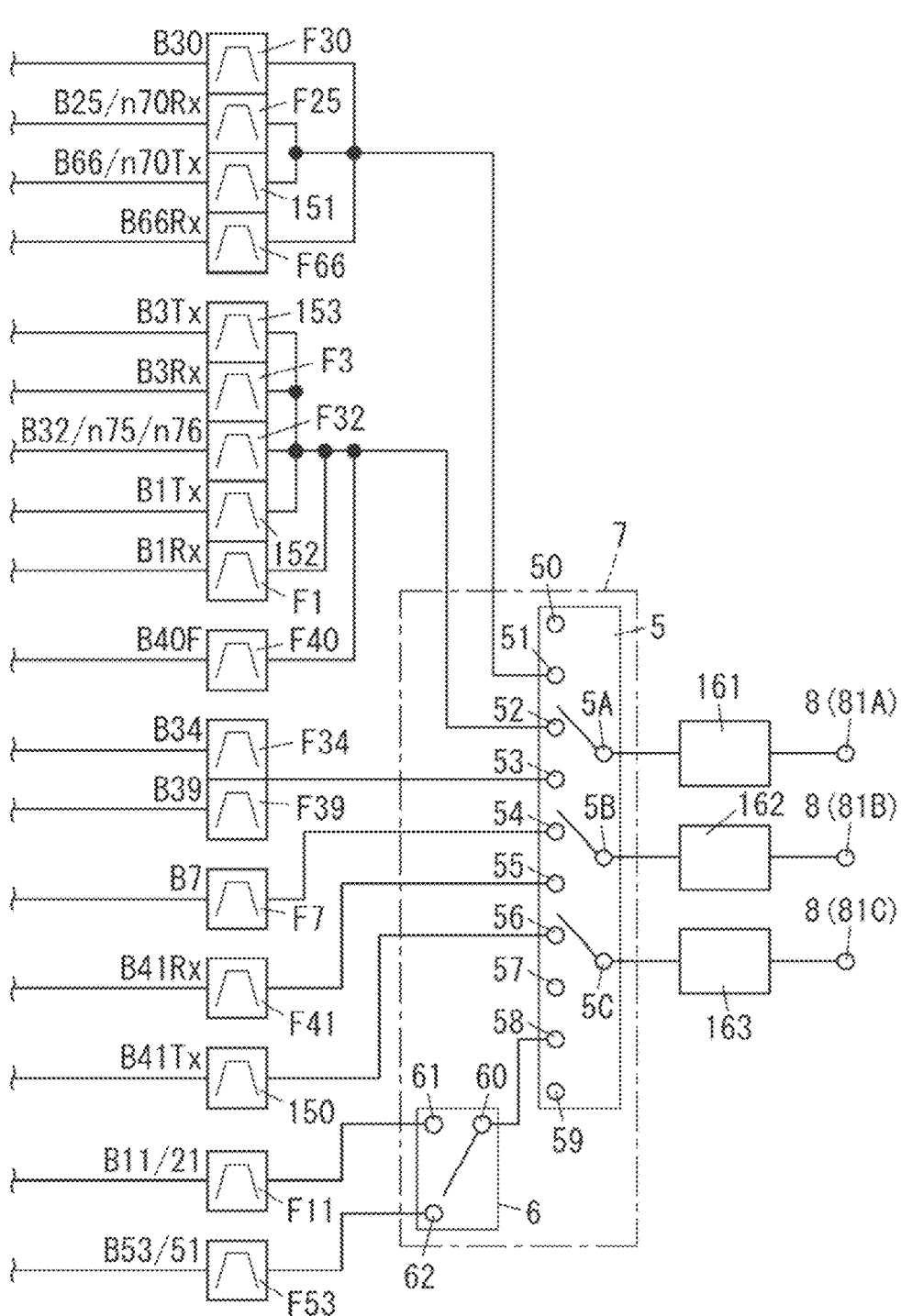
FIG. 12 is a circuit diagram for describing a connection relationship of a plurality of receive filters, a plurality of transmission filters, and a switch in the above radio-frequency module.

As shown in FIG. 9, the switch 7 includes a first switch circuit 5 and a second switch circuit 6. As shown in FIG. 12, the first switch circuit 5 has a plurality of (for example, 3) common terminals 5A, 5B, and 5C and a plurality of (for example, 9) selection terminals 50 to 59. In addition, the second switch circuit 6 has a common terminal 60 and a plurality of (for example, 2) selection terminals 58 and 59.

In the first switch circuit 5, the common terminal 5A is connected to the antenna terminal 81A with the matching circuit 161 interposed therebetween. Further, the common terminal 5B is connected to the antenna terminal 81B with the matching circuit 162 interposed therebetween. Further, the common terminal 5C is connected to the antenna terminal 81C with the matching circuit 163 interposed therebetween. Further, the selection terminal 51 is connected to three receive filters F30, F25, and F66. The selection terminal 51 is further connected to one transmission filter 151. Further, the selection terminal 52 is connected to four receive filters F3, F32, F1, and F40. The selection terminal 52 is further connected to two transmission filters 152 and 153. Further, the selection terminal 53 is connected to two receive filter F34 and F39. Further, the selection terminal 54 is connected to the receive filter F7. Further, the selection terminal 55 is connected to the receive filter F41. Further, the selection terminal 56 is connected to the transmission filter 150. Further, the selection terminal 58 is connected to the common terminal 60 of the second switch circuit 6. The selection terminal 61 of the second switch circuit 6 is connected to the receive filter F11. In addition, the selection terminal 62 of the second switch circuit 6 is connected to the receive filter F53. The first switch circuit 5 is, for example, a switch that can connect one or more of the plurality of selection terminals 50 to 59 to each of the plurality of common terminals 5A, 5B, and 5C. In this case, the first switch circuit 5 is, for example, a switch that is capable of one-to-one and one-to-many connection. The second switch circuit 6 is a switch that can be connected to one or more of the plurality of selection terminals 61 and 62 to the common terminal 60. The first switch circuit 5 and the second switch circuit 6 are controlled by, for example, the signal processing circuit 301 (refer to FIG. 8). The first switch circuit 5 switches the connection state between each of the plurality of common terminals 5A, 5B, and 5C and the plurality of selection terminals 50 to 59, for example, according to the control signal from the RF signal processing circuit 302 of the signal processing circuit 301.

(2.2) Structure of Radio-Frequency Module

Figure 3:
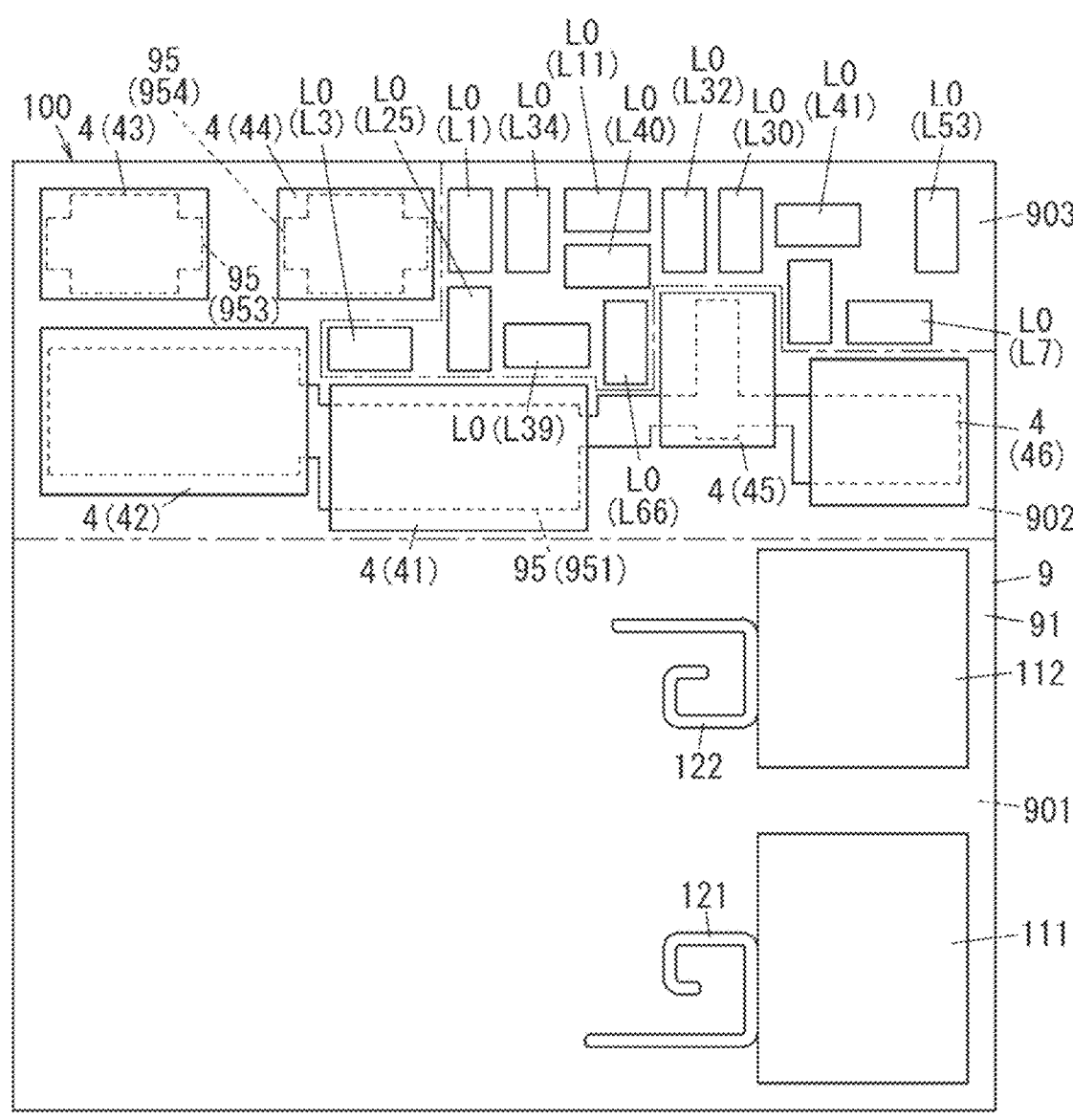
FIG. 3 is a plan view showing a ground electrode in the above radio-frequency module.

As shown in FIGS. 1 to 4, the radio-frequency module 100 includes the mounting board 9, the plurality of (for example, 6) receiving system electronic components 4, and the plurality of (for example, 13) inductors L0. Each of the plurality of receiving system electronic components 4 includes at least one receive filter F0 among the plurality of receive filters F0 (refer to FIG. 7). In addition, the radio-frequency module 100 includes the IC chip 10. The IC chip 10 includes a plurality of low-noise amplifiers A0 (refer to FIG. 7). Further, as shown in FIG. 9, the IC chip 10 includes the plurality (for example, 4) of first switches 2 and the plurality of (for example, 4) second switches 3. Further, the IC chip 10 further includes a control unit 19. In addition, the control unit 19 is connected to the signal processing circuit 301 with the plurality of (for example, 4) control terminals 84 interposed therebetween. The control unit 19 controls the plurality of low-noise amplifiers A0, the plurality of first switches 2, and the plurality of second switches 3 based on control signals acquired from the signal processing circuit 301 through the plurality of control terminals 84. Further, as shown in FIG. 1, the radio-frequency module 100 further includes an IC chip 70. The IC chip 70 includes the switch 7 having at least a part of the first switch circuit 5 and the second switch circuit 6 (refer to FIG. 9). Regarding the first switch circuit 5, the entire first switch circuit 5 may be included in the IC chip 70, or a part of the wiring of the first switch circuit 5 may be included in the mounting board 9. Further, the radio-frequency module 100 further includes three matching circuits 161, 162, and 163 as shown in FIG. 9 (refer to FIG. 9). In addition, the radio-frequency module 100 further includes two amplifiers 111 and 112 and two transformers 121 and 122 of two power amplifiers 110A and 110B, two output matching circuits 131 and 132, the switch 17, the switch 14, and the controller 18. Moreover, the radio-frequency module 100 includes a plurality of external connection terminals 8 as shown in FIGS. 2 and 8. In addition, as shown in FIG. 2, the radio-frequency module 100 includes a resin layer 190 (hereinafter referred to as a first resin layer 190), a metal electrode layer 200, and a second resin layer 210. Further, the radio-frequency module 100 further includes a ground electrode 95 (refer to FIGS. 2 and 3). In addition, FIG. 1 does not show the first resin layer 190 and the metal electrode layer 200. In addition, in FIG. 1, the ground electrode 95 shown in FIG. 3 is omitted.

An outer edge of the mounting board 9 has a quadrangle shape in plan view in the thickness direction D1 of the mounting board 9. As shown in FIG. 2, the mounting board 9 has the first main surface 91 and the second main surface 92 facing each other in the thickness direction D1 of the mounting board 9. Further, the mounting board 9 has an outer peripheral surface 93. The outer peripheral surface 93 of the mounting board 9 includes, for example, four side surfaces that connect the outer edge of the first main surface 91 and the outer edge of the second main surface 92 of the mounting board 9, and does not include the first main surface 91 and the second main surface 92. That is, the mounting board 9 is a multilayer substrate including the plurality of dielectric layers and the plurality of conductive layers. The plurality of dielectric layers and the plurality of conductive layers are laminated in the thickness direction D1 of the mounting board 9. The plurality of conductive layers are formed in a predetermined pattern determined for each layer. Each of the plurality of conductive layers includes one or a plurality of conductor portions in one plane orthogonal to the thickness direction D1 of the mounting board 9. A material of each conductive layer is, for example, copper. The plurality of conductive layers include a ground layer. In the radio-frequency module 100, the plurality of ground terminals 85 and the ground layer are electrically connected to each other with the via-conductor and the like of the mounting board 9 interposed therebetween. The mounting board 9 is, for example, a printed wiring board. The mounting board is not limited to a printed wiring board, and may be, for example, a low temperature co-fired ceramics (LTCC) substrate, a high temperature co-fired ceramics (HTCC) substrate, or a resin multilayer substrate.

Further, the mounting board 9 is not limited to the printed wiring board, and may be, for example, a wiring structure. The wiring structure is, for example, a multilayer structure. The multilayer structure includes at least one insulating layer and at least one conductive layer. The insulating layer is formed in a predetermined pattern. In a case where the number of insulating layers is plural, the plurality of insulating layers are formed in a predetermined pattern determined for each layer. The conductive layer is formed in a predetermined pattern different from the predetermined pattern of the insulating layer. In a case where the number of conductive layers is plural, the plurality of conductive layers are formed in a predetermined pattern determined for each layer. The conductive layer may include one or a plurality of rewiring portions. In the wiring structure, a first surface of two surfaces facing each other in the thickness direction of the multilayer structure is the first main surface 91 of the mounting board 9, and a second surface is the second main surface 92 of the mounting board 9. The wiring structure may be, for example, an interposer. The interposer may be an interposer using a silicon substrate or may be a substrate having multiple layers.

The first main surface 91 and the second main surface 92 of the mounting board 9 are separated in the thickness direction D1 of the mounting board 9, and intersect with the thickness direction D1 of the mounting board 9. The first main surface 91 of the mounting board 9 is, for example, orthogonal to the thickness direction D1 of the mounting board 9, and may include, for example, a side surface or the like of a conductor portion as a surface that is not orthogonal to the thickness direction D1. In addition, for example, the second main surface 92 of the mounting board 9 is orthogonal to the thickness direction D1 of the mounting board 9, but may include, for example, a side surface of the conductor portion or the like, as a surface that is not orthogonal to the thickness direction D1. Further, the first main surface 91 and the second main surface 92 of the mounting board 9 may be formed with a fine roughness portion, a recess portion, or a projection portion. For example, assuming a recess portion is formed on the first main surface 91 of the mounting board 9, the inner surface of the recess portion is included in the first main surface 91.

In the radio-frequency module 100, a plurality of first circuit components are mounted on the first main surface 91 of the mounting board 9. The plurality of first circuit components include a plurality of (for example, 6) receiving system electronic components 4, a plurality of (for example, 13) inductors L0, and a plurality of transmitting system electronic components. Each of the plurality of inductors L0 is a surface mount electronic component, that is, a chip inductor. Further, the plurality of first circuit components include a plurality of inductors and a plurality of capacitors of each of the output matching circuits 131 and 132 (refer to FIG. 9). Each of the plurality of inductors included in each of the output matching circuits 131 and 132 is a surface mount electronic component, that is, a chip inductor. In addition, each of the plurality of capacitors included in the output matching circuits 131 and 132 is a surface mount electronic component, that is, a chip capacitor. The fact that "the first circuit components are mounted on the first main surface 91 of the mounting board 9" means that the first circuit components are disposed on (mechanically connected to) the first main surface 91 of the mounting board 9 and the first circuit components are electrically connected to the (appropriate conductor portion of) mounting board 9.

In the radio-frequency module 100, a plurality of second circuit components are mounted on the second main surface 92 of the mounting board 9. The plurality of second circuit components include the IC chip 70 and the IC chip 10. The fact that "the second circuit components are mounted on the second main surface 92 of the mounting board 9" means that the second circuit components are disposed on (mechanically connected to) the second main surface 92 of the mounting board 9 and the second circuit components are electrically connected to the (appropriate conductor portion of) mounting board 9.

An outer edge of each of the plurality of receiving system electronic components 4 has, for example, a quadrangle shape in plan view in the thickness direction D1 of the mounting board 9. As shown in FIG. 2, each of the plurality of receiving system electronic components 4 includes a surface 401 on the mounting board 9 side, a main surface 402 opposite to the mounting board 9 side, at least four side surfaces 403, and a ground terminal 405 that is disposed on the surface 401 on the mounting board 9 side and is connected to the mounting board 9. Hereinafter, for convenience of the description, when the plurality of receiving system electronic components 4 are distinguished, the receiving system electronic components 4 are referred to as the receiving system electronic component 41, the receiving system electronic component 42, the receiving system electronic component 43, the receiving system electronic component 44, the receiving system electronic component 45, and the receiving system electronic component 46 (refer to FIGS. 1 and 3). The receiving system electronic component 41 includes, for example, three receive filters F30, F25, and F66 (refer to FIG. 7). The receiving system electronic component 42 includes, for example, three receive filters F3, F32, and F1 (refer to FIG. 7). The receiving system electronic component 43 includes, for example, one receive filter F40 (refer to FIG. 7). The receiving system electronic component 44 includes, for example, two receive filters F34 and F39 (refer to FIG. 7). The receiving system electronic component 45 includes, for example, two receive filters F7 and F41 (refer to FIG. 7). The receiving system electronic component 46 includes, for example, two receive filters F11 and F53 (refer to FIG. 7). Therefore, in the radio-frequency module 100, the plurality of receive filters F0 (refer to FIG. 7) are disposed on the first main surface 91 of the mounting board 9.

Each of the plurality of receive filter F0 is, for example, a ladder filter, and includes a plurality of (for example, 4) series arm resonators and a plurality of (for example, 3) parallel arm resonators. Each of the plurality of receive filters F0 is, for example, an acoustic wave filter. Here, in the acoustic wave filter, for example, each of a plurality of series arm resonators and a plurality of parallel arm resonators is configured with an acoustic wave resonator. The acoustic wave filter is, for example, a surface acoustic wave filter that uses surface acoustic waves. In the surface acoustic wave filter, each of the plurality of series arm resonators and the plurality of parallel arm resonators is, for example, a surface acoustic wave (SAW) resonator, and has an interdigital transducer (IDT) electrode.

Each of the plurality of inductors L0 (refer to FIG. 1) is a chip inductor, as described above. In addition, an outer edge of each of the plurality of inductors L0 has a quadrangle shape in plan view in the thickness direction D1 of the mounting board 9.

Figure 5A:
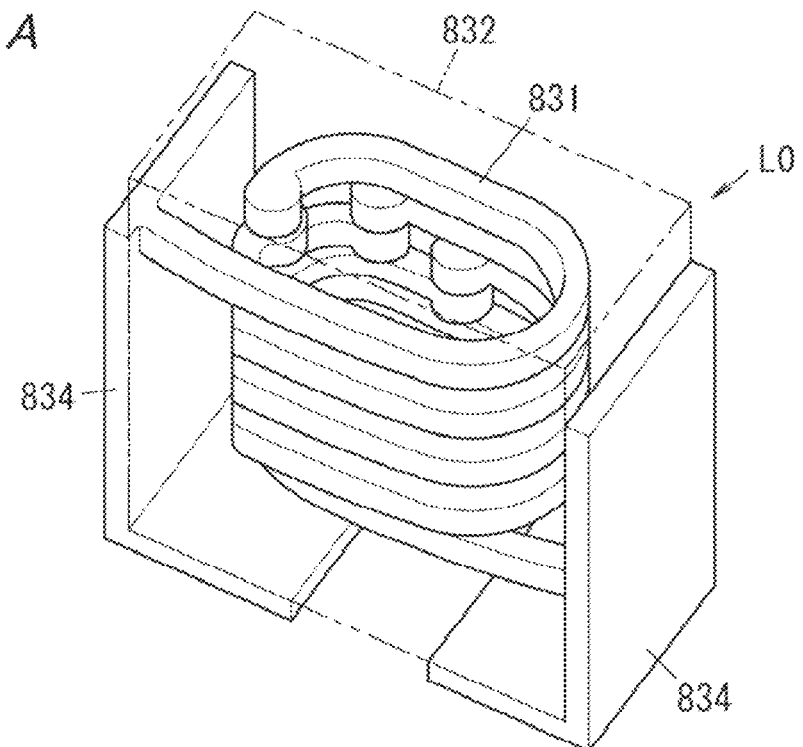
FIG. 5A is a see-through perspective view of a vertically wound inductor in the above radio-frequency module.
Figure 5B:
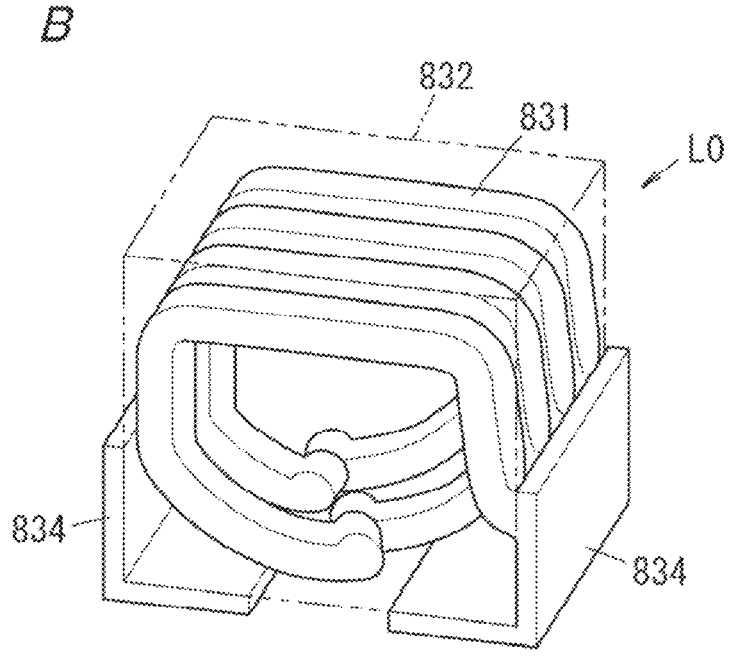
FIG. 5B is a see-through perspective view of a horizontally wound inductor in the above radio-frequency module.

For example, as shown in FIG. 5A or 5B, each of the plurality of inductors L0 includes a winding portion 831, a rectangular parallelepiped element body 832 that covers the winding portion 831, and a pair of outer electrodes 834 disposed at both ends of the element body 832 in the longitudinal direction. The winding portion 831 is disposed in the element body 832. The winding portion 831 is connected between the pair of outer electrodes 834. The winding portion 831 is a coil conductor portion and has conductivity. A shape of the winding portion 831 is, for example, a spiral shape. The material of the element body 832 includes ceramic. The material of each of the pair of outer electrodes 834 is, for example, Cu, Ag, and the like. The material of the winding portion 831 includes, for example, the same material as the pair of outer electrodes 834, but the present disclosure is not limited thereto. In the radio-frequency module 100 (refer to FIGS. 1 and 2), among the plurality of inductors L0, the inductors L1, L3, L30, L32, L34, L39, L40, and L41 are vertically wound inductors as shown in FIGS. 5A, and are mounted on the first main surface 91 of the mounting board 9 such that a winding axis V1 (refer to FIG. 6) of the winding portion 831 is parallel to the thickness direction D1 of the mounting board 9. In addition, among the plurality of inductors L0, the inductors L7, L11, L25, and L53 are horizontally wound inductors as shown in FIG. 5B, and are mounted on the first main surface 91 of the mounting board 9 such that the direction of the winding axis V1 (refer to FIG. 6) of the winding portion 831 is one direction orthogonal to the thickness direction D1 of the mounting board 9.

An outer edge of each of the plurality of transmitting system electronic components has, for example, a quadrangle shape in plan view in the thickness direction D1 of the mounting board 9. The plurality of transmitting system electronic components include, for example, the amplifier 111 of the power amplifier 110A, the amplifier 112 of the power amplifier 110B, and the plurality of transmission filters 150 to 153 (refer to FIG. 9). In FIG. 1, the plurality of transmission filters 150 to 153 are not shown. Each of the amplifiers 111 and 112 of the power amplifiers 110A and 110B is an IC chip for power amplification. The power amplification IC chip is, for example, a GaAs IC chip assuming the amplification transistor is a Heterojunction Bipolar Transistor (HBT). In addition, the power amplification IC chip is, for example, a Si-based IC chip, for example, assuming the amplification transistor is a bipolar transistor or a field effect transistor (FET).

Each of the plurality of transmission filters 150 to 153 is, for example, a ladder filter, and includes a plurality of (for example, 4) series arm resonators and a plurality of (for example, 3) parallel arm resonators. Each of the plurality of transmission filters 150 to 153 is, for example, an acoustic wave filter. Here, in the acoustic wave filter, for example, each of a plurality of series arm resonators and a plurality of parallel arm resonators is configured with an acoustic wave resonator. The acoustic wave filter is, for example, a surface acoustic wave filter that uses surface acoustic waves. In the surface acoustic wave filter, each of the plurality of series arm resonators and the plurality of parallel arm resonators is, for example, an SAW resonator, and has an IDT electrode.

The IC chip 10 including the plurality of low-noise amplifiers A0 (refer to FIG. 11) is mounted on the second main surface 92 of the mounting board 9 as shown in FIGS. 1 and 2. Therefore, the plurality of low-noise amplifiers A0 are disposed on the second main surface 92 of the mounting board 9. An outer edge of the IC chip 10 has a quadrangle shape in plan view in the thickness direction D1 of the mounting board 9.

In addition, the IC chip 70 (refer to FIG. 1) including the switch 7 having the first switch circuit 5 and the second switch circuit 6 is mounted on the second main surface 92 of the mounting board 9. An outer edge of the IC chip 70 has a quadrangle shape in plan view in the thickness direction D1 of the mounting board 9.

The plurality of external connection terminals 8 (refer to FIGS. 2 and 8) are disposed on the second main surface 92 of the mounting board 9. The fact that "the external connection terminals 8 are disposed on the second main surface 92 of the mounting board 9" means that the external connection terminals 8 are mechanically connected to the second main surface 92 of the mounting board 9 and the external connection terminals 8 are electrically connected to the (appropriate conductor portion of) mounting board 9.

The plurality of external connection terminals 8 include three antenna terminals 81A, 81B, and 81C, four signal output terminals 82A, 82B, 82C, and 82D, two signal input terminals 83A and 83B, the plurality of control terminals 84, and the plurality of ground terminals 85. The plurality of ground terminals 85 are electrically connected to the ground layer of the mounting board 9. The ground layer is a circuit ground of the radio-frequency module 100, and the plurality of circuit components of the radio-frequency module 100 include circuit components electrically connected to the ground layer.

Materials of the plurality of external connection terminals 8 are, for example, metal (for example, copper, copper alloy, or the like). The plurality of external connection terminals 8 are not constituent elements of the mounting board 9, but may be constituent elements of the mounting board 9. Each of the plurality of external connection terminals 8 is a columnar electrode (for example, a cylindrical electrode).

As shown in FIG. 2, the first resin layer 190 is disposed on the first main surface 91 of the mounting board 9. The first resin layer 190 contains resin (for example, epoxy resin). The first resin layer 190 may contain a filler in addition to resin. The first resin layer 190 has electric insulation.

The first resin layer 190 covers four outer side surfaces 403 of each of the plurality of receiving system electronic components 4. The first resin layer 190 does not cover the main surface 402 of each of the plurality of receiving system electronic components 4. Further, the first resin layer 190 covers two power amplifiers 110A and 110B, the plurality of inductors and the plurality of capacitors of each of the two output matching circuits 131 and 132, and the plurality of inductors L0.

The metal electrode layer 200 covers the main surfaces 402 of each of the plurality of receiving system electronic components 4, the main surface 191 of the first resin layer 190 opposite to the mounting board 9 side, the outer peripheral surface 193 of the first resin layer 190, the outer peripheral surface 93 of the mounting board 9, and an outer peripheral surface 213 of the second resin layer 210. The metal electrode layer 200 is in contact with at least a part of the outer peripheral surface of the ground layer of the mounting board 9. Thus, a potential of the metal electrode layer 200 can be set to be the same as a potential of the ground layer. The metal electrode layer 200 has a multilayer structure in which a plurality of metal layers are laminated, but the present disclosure is not limited thereto, and the metal electrode layer 200 may be formed of one metal layer. The metal layer includes one or more metals. Assuming the metal electrode layer 200 has a multilayer structure in which a plurality of metal layers are laminated, for example, a first metal layer (for example, a first stainless steel layer), a second metal layer (for example, a Cu layer) on the first metal layer, and a third metal layer (for example, a second stainless steel layer) on the second metal layer. A material of each of the first stainless steel layer and the second stainless steel layer is an alloy including Fe, Ni, and Cr. In addition, the metal electrode layer 200 is, for example, a Cu layer assuming the metal electrode layer 200 is formed of one metal layer.

In the radio-frequency module 100, the metal electrode layer 200 is in contact with the entire main surface 402 of each of the plurality of receiving system electronic components 4.

The second resin layer 210 covers the IC chip 10, the IC chip 70, and the outer peripheral surfaces of each of the plurality of external connection terminals 8. The second resin layer 210 contains resin (for example, epoxy resin). The second resin layer 210 may contain a filler in addition to resin. The material of the second resin layer 210 may be the same material as the material of the first resin layer 190 or may be a different material. The second resin layer 210 covers the IC chip 10 and the IC chip 70, but is not limited thereto, and need not cover the main surface opposite to the mounting board 9 side in the IC chip 10 and the main surface opposite to the mounting board 9 side in the IC chip 70. In addition, the second resin layer 210 does not cover the end surface of the plurality of external connection terminals 8 opposite to the mounting board 9 side.

(2.3) Layout

In the radio-frequency module 100, the plurality of transmitting system electronic components, the plurality of receiving system electronic components 4, and the plurality of inductors L0 are disposed on the first main surface 91 of the mounting board 9. The mounting board 9 includes a first region 901 that overlaps the plurality of transmitting system electronic components in plan view in the thickness direction D1 of the mounting board 9, a second region 902 that overlaps the plurality of receiving system electronic components 4 in plan view in the thickness direction D1 of the mounting board 9, and a third region 903 that overlaps the plurality of inductors L0 in plan view in the thickness direction D1 of the mounting board 9. The mounting board 9 has the second region 902 between the first region 901 and the third region 903.

The radio-frequency module 100 further includes three ground electrodes 95 (refer to FIGS. 2 and 3) disposed on the first main surface 91 of the mounting board 9. Each of the three ground electrodes 95 overlaps a part of at least one receiving system electronic component 4 among the plurality of (6) receiving system electronic components 4 in plan view in the thickness direction D1 of the mounting board 9, and is connected to at least one receiving system electronic component 4. More specifically, as shown in FIG. 3, the three ground electrodes 95 include a ground electrode 951 that overlaps the four receiving system electronic components 41, 42, 45, and 46 and a ground electrode 953 that overlaps one receiving system electronic component 43, and a ground electrode 954 that overlaps one receiving system electronic component 44. The ground electrode 951 is connected to the ground terminals 405 of each of the four receiving system electronic components 41, 42, 45, and 46. The ground electrode 953 is connected to the ground terminal 405 of the receiving system electronic component 43. The ground electrode 954 is connected to the ground terminal 405 of the receiving system electronic component 44.

The plurality of inductors L0 include five inductors L1, L3, L40, L32, and L7 which are connected between five receive filters F1, F3, F40, F32, and F7 (refer to FIG. 7) and five low-noise amplifiers A1, A3, A40, A32, and A7 (refer to FIG. 7) corresponding to Band 1, Band 3, Band 40, Band 32, and Band 7 of the 3GPP LTE standard. Band 1, Band 3, Band 40, Band 32, and Band 7 of the 3GPP LTE standard are an example of a combination of two or more (5) communication bands capable of simultaneous communication.

In addition, the plurality of inductors L0 include four inductors L25, L66, L30, and L7 connected between four receive filters F25, F66, F30, and F7 (refer to FIG. 7) and four low-noise amplifiers A25, A66, A30, and A7 (refer to FIG. 7) corresponding to Band 25, Band 66, Band 30, and Band 7 of the 3GPP LTE standard. Band 25, Band 66, Band 30, and Band 7 of the 3GPP LTE standard are other examples of a combination of two or more (4) communication bands in which simultaneous communication.

In addition, the plurality of inductors L0 include three inductors L34, L39, and L41 which are connected between three receive filters F34, F39, and F41 (refer to FIG. 7) and three low-noise amplifiers A34, A39, and A41 (refer to FIG. 7) corresponding to Band 34, Band 39, and Band 41 of the 3GPP LTE standard. Band 34, Band 39, and Band 41 of the 3GPP LTE standard are other examples of a combination of two or more (3) communication bands capable of simultaneous communication.

Figure 4:
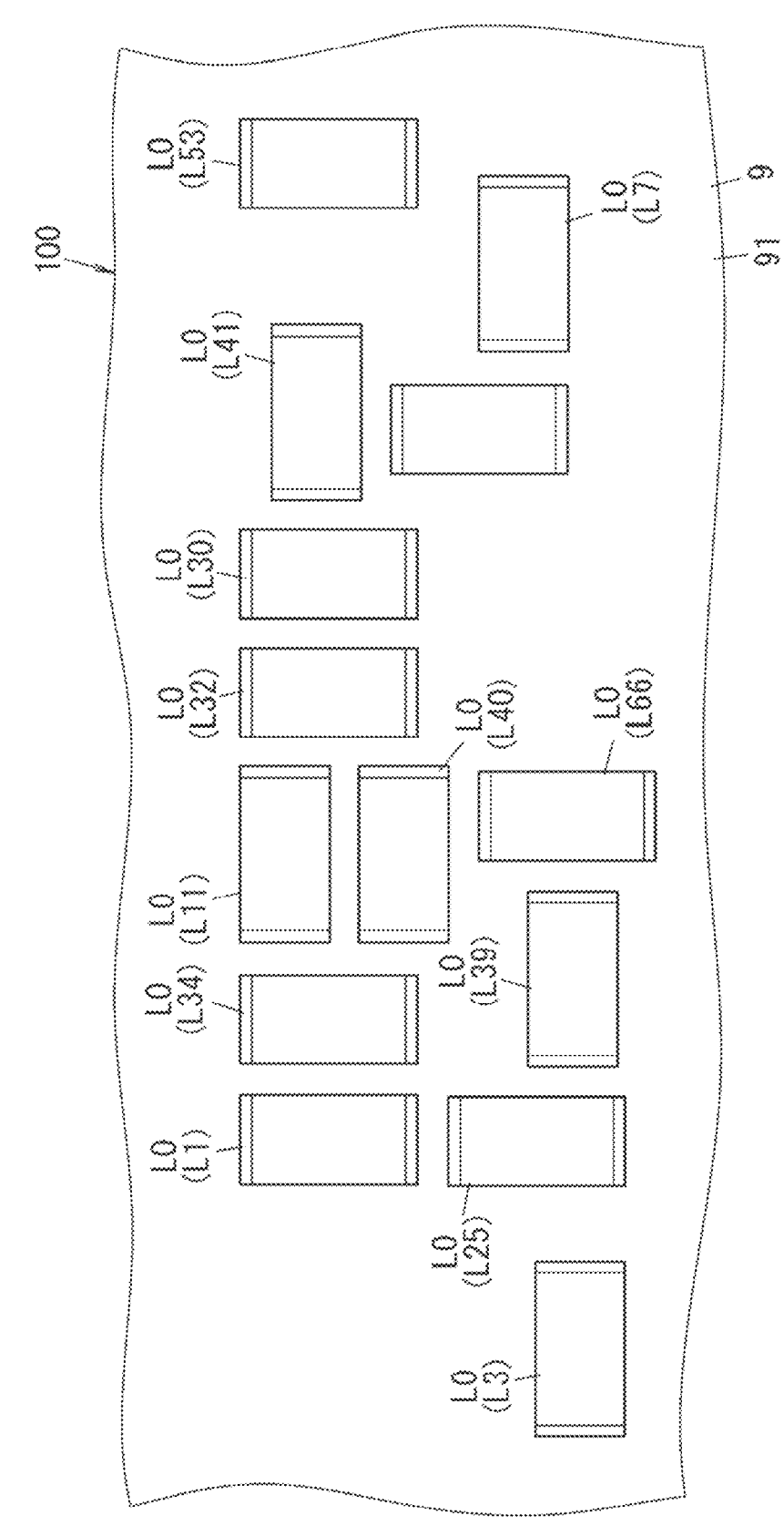
FIG. 4 is a plan view describing a layout of a plurality of inductors in the above radio-frequency module of the same.
Figure 6:
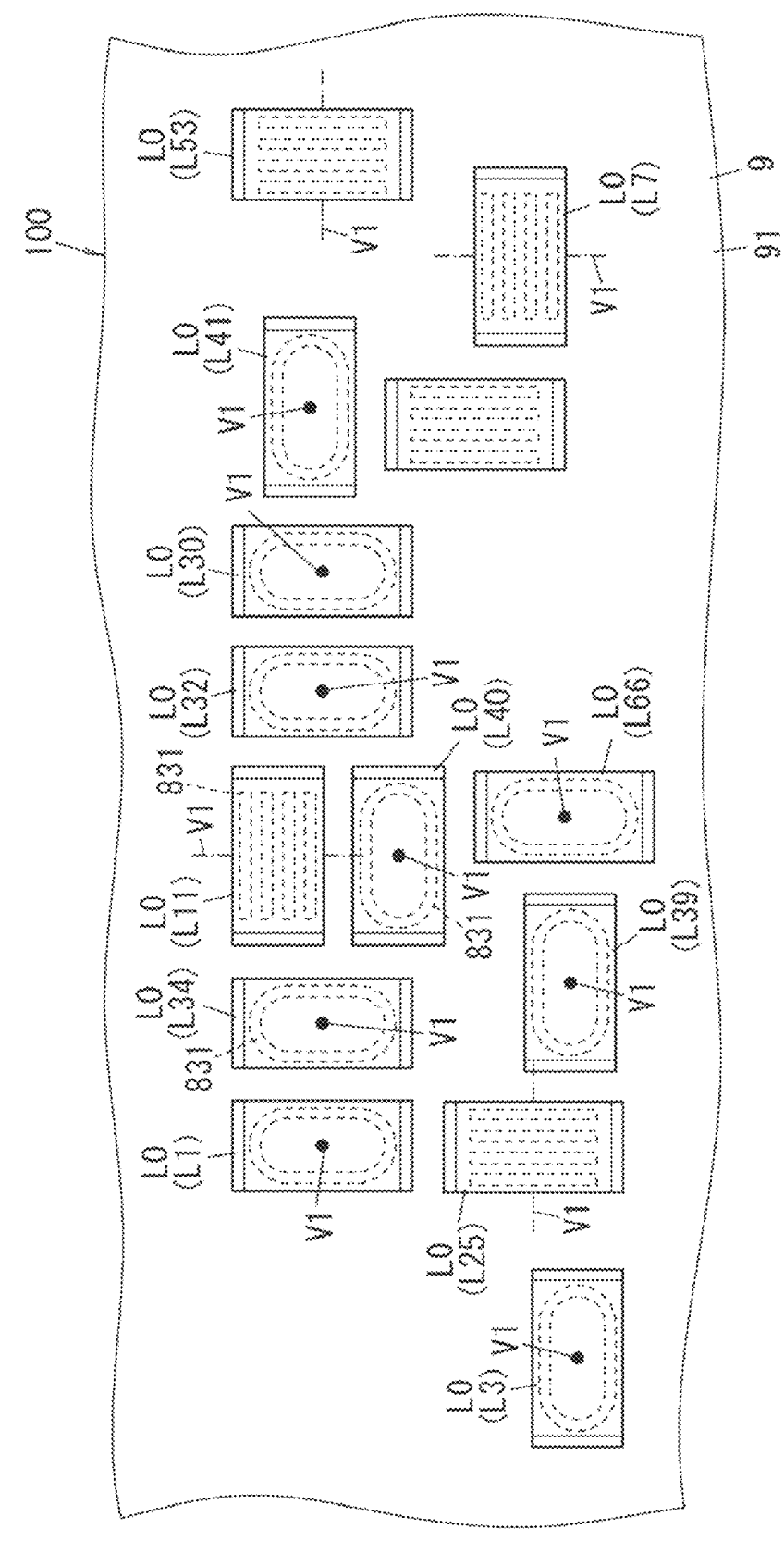
FIG. 6 is another plan view describing a layout of a plurality of inductors in the above radio-frequency module.

In the radio-frequency module 100, in plan view in the thickness direction D1 of the mounting board 9, as shown in FIGS. 4 and 6, one inductor L34 (second inductor) among the three inductors L34, L39, and L41 is positioned between the two inductors L1 and L40 (two first inductors) among the five inductors L1, L3, L40, L32, and L7.

For example, in the radio-frequency module 100, in plan view in the thickness direction D1 of the mounting board 9, as shown in FIGS. 4 and 6, one inductor L34 (second inductor) among the three inductors L34, L39, and L41 is positioned between the two inductors L1 and L32 (two first inductors) among the five inductors L1, L3, L40, L32, and L7.

Further, in the radio-frequency module 100, in plan view in the thickness direction D1 of the mounting board 9, as shown in FIGS. 4 and 6, one inductor L39 (second inductor) among the three inductors L34, L39, and L41 is positioned between the two inductors L25 and L66 (two first inductors) among the four inductors L25, L66, L30, and L7.

Further, in the radio-frequency module 100, in plan view in the thickness direction D1 of the mounting board 9, as shown in FIGS. 4 and 6, two inductor L40 and L32 (two second inductors) among five inductors L1, L3, L40, L32, and L7 are positioned between the two inductors L25 and L30 (two first inductors) among the four inductors L25, L66, L30, and L7. The fact that "the two inductors L40 and L32 are positioned between the two inductors L25 and L30" means that at least one line segment from the group of line segments passes through two inductors L40 and L32 in a group of line segments that connects any point of the inductor L25 and any point of the inductor L30 in plan view in the thickness direction D1 of the mounting board 9.

In the radio-frequency module 100, in plan view in the thickness direction D1 of the mounting board 9, as shown in FIGS. 4 and 6, two inductors L40 and L32 of the five inductors L1, L3, L40, L32, and L7 are adjacent to each other. The fact that "the two inductors L40 and L32 are adjacent to each other" means that there is no other circuit component (including the inductor L0 other than the inductors L40 and L32 among the plurality of inductors L0) mounted on the first main surface 91 of the mounting board 9 between the two inductors L40 and L32 in plan view in the thickness direction D1 of the mounting board 9, and the inductor L40 and the inductor L32 are adjacent to each other. Here, each of the inductor L40 and the inductor L32 is, for example, a vertically wound inductor as shown in FIG. 5A, and is disposed such that the winding axis V1 (refer to FIG. 6) of the winding portion 831 is parallel to the thickness direction D1 of the mounting board 9. Therefore, in the radio-frequency module 100, the winding axis V1 of the winding portion 831 of the inductor L40 does not intersect with the inductor L32, and the winding axis V1 of the winding portion 831 of the inductor L32 does not intersect with the inductor L40.

(3) Communication Device

As shown in FIG. 8, the communication device 300 includes the radio-frequency module 100 and the signal processing circuit 301. The signal processing circuit 301 is connected to the radio-frequency module 100.

The communication device 300 further includes the plurality of (for example, 3) antennas AN1, AN2, and AN3. The communication device 300 further includes a circuit board on which the radio-frequency module 100 is mounted. The circuit board is, for example, a printed wiring board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC) and performs signal processing on a radio-frequency signal. The RF signal processing circuit 302 performs signal processing, such as upconversion, on the radio-frequency signal (transmission signal) output from the baseband signal processing circuit 303, and outputs the radio-frequency signal on which the signal processing is performed. In addition, the RF signal processing circuit 302 performs signal processing, such as downconversion, on the radio-frequency signal (reception signal) output from the radio-frequency module 100, and outputs the radio-frequency signal on which the signal processing is performed to the baseband signal processing circuit 303. The baseband signal processing circuit 303 is, for example, a baseband integrated circuit (BBIC). The baseband signal processing circuit 303 generates an I-phase signal and a Q-phase signal from the baseband signal. The baseband signal is, for example, an audio signal, an image signal, and the like input from the outside. The baseband signal processing circuit 303 performs IQ modulation processing by combining the I-phase signal and the Q-phase signal, and outputs a transmission signal. In this case, the transmission signal is generated as a modulation signal (IQ signal) by amplitude modulation of a carrier wave signal of a predetermined frequency in a period longer than a period of the carrier wave signal. The reception signal processed by the baseband signal processing circuit 303 is used, for example, as an image signal for image display or as an audio signal for a call by the user of the communication device 300. The radio-frequency module 100 transmits the radio-frequency signal (the reception signal and the transmission signal) between the plurality of antennas AN1, AN2, and AN3 and the RF signal processing circuit 302 of the signal processing circuit 301.

The plurality of electronic components that configure the signal processing circuit 301 may be mounted on, for example, the above-described circuit board, or may be mounted on a circuit board (second circuit board) different from the circuit board (first circuit board) on which the radio-frequency module 100 is mounted.

(4) Effect (4.1) Radio-Frequency Module

The radio-frequency module 100 according to Embodiment 1 includes the mounting board 9, the plurality of receive filters F0, the plurality of low-noise amplifiers A0, and the plurality of inductors L0. The mounting board 9 has the first main surface 91 and the second main surface 92 facing each other. The plurality of receive filters F0 are disposed on the mounting board 9. The plurality of receive filters F0 correspond to a plurality of communication bands. The plurality of low-noise amplifiers A0 are disposed on the mounting board 9. Each of the plurality of low-noise amplifiers A0 has an input terminal and an output terminal. The plurality of inductors L0 are disposed on the first main surface 91 of the mounting board 9. The plurality of inductors L0 are connected between the input terminals of the plurality of low-noise amplifiers A0 and the plurality of receive filters F0. The plurality of communication bands include two or more communication bands included in a first combination of communication bands capable of simultaneous communication and two or more communication bands included in a second combination of communication bands capable of simultaneous communication. The plurality of inductors L0 include two or more first inductors connected to two or more receive filters F0 corresponding to two or more communication bands included in the first combination among the plurality of receive filters F0, and two or more second inductors connected to the two or more receive filters F0 corresponding to the two or more communication bands included in the second combination among the plurality of receive filters F0. In plan view in the thickness direction D1 of the mounting board 9, at least one second inductor among the two or more second inductors is positioned between two first inductors among the two or more first inductors.

In the radio-frequency module 100 according to Embodiment 1, it is possible to suppress the deterioration in characteristics during simultaneous communication. More specifically, in the radio-frequency module 100 according to Embodiment 1, since at least one second inductor is positioned between the two first inductors, it is possible to suppress electromagnetic coupling/electric field coupling between the two first inductors during simultaneous communication, and it is possible to suppress signal leakage between the two first inductors. Accordingly, in the radio-frequency module 100 according to Embodiment 1, it is possible to suppress the deterioration in characteristics during simultaneous communication.

Figure 13:
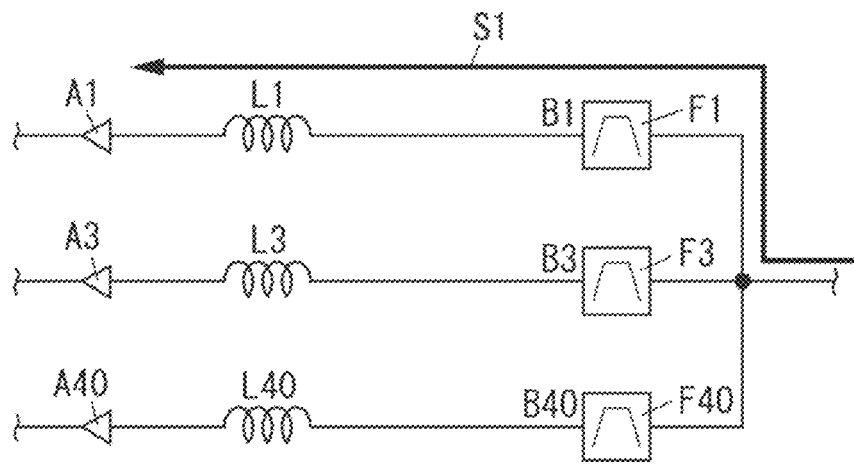
FIG. 13 is an operation explanatory diagram of a radio-frequency module according to a comparative example.
Figure 14:
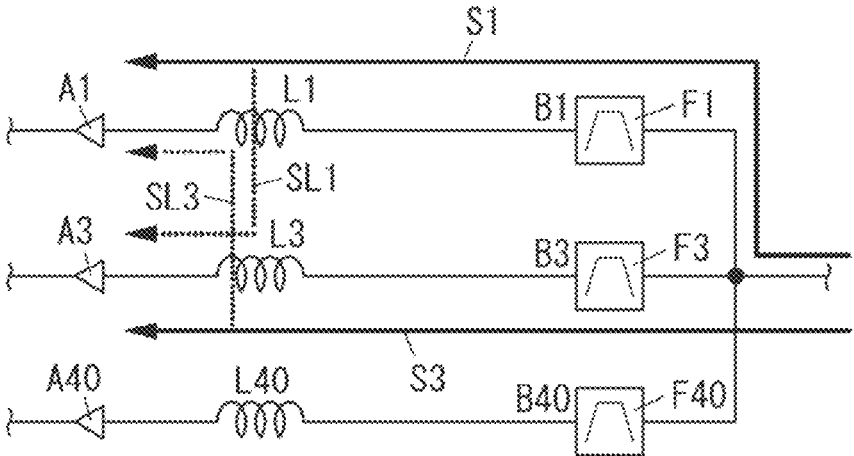
FIG. 14 is another operation explanatory diagram of a radio-frequency module according to a comparative example.

FIGS. 13 and 14 are operation explanatory diagrams of a radio-frequency module according to a comparative example. A radio-frequency module according to a comparative example is a module in which the two inductors L1 and L3 are disposed such that both of the two inductors L1 and L3 in the radio-frequency module 100 according to Embodiment 1 are horizontally wound inductors and the winding axes V1 thereof are aligned in a straight line. In FIG. 13, for example, assuming performing reception using the receive filter F1 corresponding to Band 1 out of two communication bands (for example, Band 1 and Band 3) included in the first combination, the path of a signal S1 that has passed through the receive filter F1 is shown by a solid arrow. Further, in FIG. 14, for example, assuming performing simultaneous reception using two receive filters F0 (for example, the receive filters F1 and F3) corresponding to two communication bands (for example, Band 1 and Band 3) included in the first combination, among the signals S1 that have passed through the receive filter F1, a leakage signal SL1 that leaks due to electromagnetic coupling/electric field coupling between the two inductors L1 and L3 is indicated by a dotted line. In addition, in FIG. 14, among signals S3 that have passed through the receive filter F3, a leakage signal SL3 that leaks due to electromagnetic coupling/electric field coupling between the two inductors L1 and L3 is indicated by a dotted line.

On the other hand, in the radio-frequency module 100 according to Embodiment 1, the signal S1 that has passed through the receive filter F1 and the signal S3 that has passed through the receive filter F3 each leaks due to the electromagnetic coupling/electric field coupling of the two inductors L1 and L3 can be suppressed, and the attenuation characteristics of each of the signals S1 and S3 input to the low-noise amplifiers A1 and A3 can be improved.

Further, the radio-frequency module 100 according to Embodiment 1 further includes a ground electrode 951 that overlaps the four receiving system electronic components 41, 42, 45, and 46. As can also be understood from FIG. 3, the ground electrode 951 is disposed in the second region 902 between the first region 901 that overlaps the plurality of transmitting system electronic components and the third region 903 that overlaps the plurality of inductors L0 on the mounting board 9. In addition, the ground electrode 951 is positioned along the boundary between the first region 901 and the second region 902 in plan view in the thickness direction D1 of the mounting board 9. Accordingly, in the radio-frequency module 100 according to Embodiment 1, it is possible to further suppress leakage of signals (transmission signals) that pass through the transmitting system electronic components and the like disposed in the first region 901 of the mounting board 9 to the plurality of inductors L0 disposed in the third region 903. Therefore, the radio-frequency module 100 according to Embodiment 1 can suppress the deterioration in the characteristics of each of the transmitting circuit 102 and the receiving circuit 101.

(4.2) Communication Device

Further, the communication device 300 according to Embodiment 1 includes the radio-frequency module 100 and the signal processing circuit 301. Accordingly, in the communication device 300 according to Embodiment 1, it is possible to suppress the deterioration in characteristics during simultaneous communication.

Embodiment 2

Figure 15A:
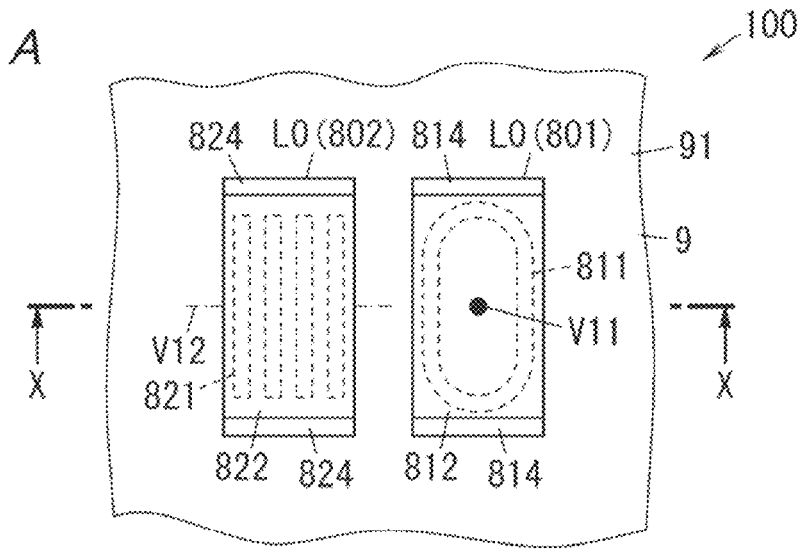
FIG. 15A is a plan view of main portions in a radio-frequency module according to Embodiment 2.
Figure 15B:
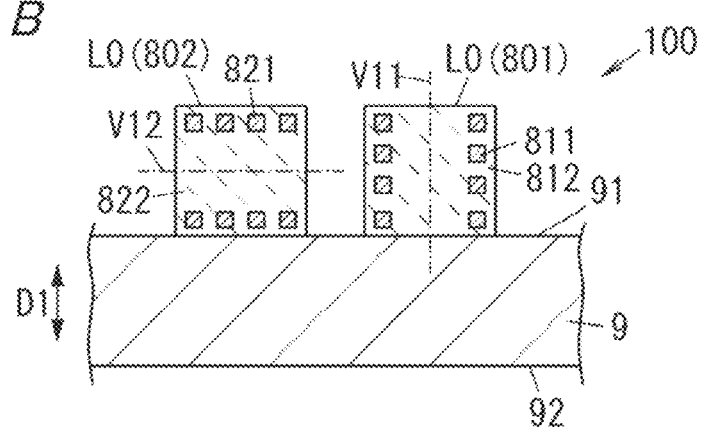
FIG. 15B is a cross-sectional view taken along line X-X in FIG. 15A.

As shown in FIGS. 15A and 15B, the radio-frequency module 100 according to Embodiment 2 is different from the radio-frequency module 100 (refer to FIGS. 1 and 2) according to Embodiment 1 in that the two inductors L0 used during simultaneous communication are adjacent to each other in plan view in the thickness direction D1 of the mounting board 9. Since the circuit configuration and structure of the radio-frequency module 100 according to Embodiment 2 will be the same as the circuit configuration and structure of the radio-frequency module 100 according to Embodiment 1, the illustration and description thereof will be appropriately omitted. In the radio-frequency module 100 according to Embodiment 2, the position of the inductor L34 and the position of the inductor L40 are switched such that the two inductors L1 and L40 used for simultaneous communication in the radio-frequency module 100 according to Embodiment 1 are adjacent to each other. In FIGS. 15A and 15B, the two inductors L1 and L40 are shown as two inductors L0.

The two inductors L0 used during the simultaneous communication include a first inductor 801 (for example, the inductor L40) and a second inductor 802 (for example, the inductor L1). The first inductor 801 has a first winding portion 811. The second inductor 802 has a second winding portion 821. The second inductor 802 is adjacent to the first inductor 801 in plan view in the thickness direction D1 of the mounting board 9.

The first inductor 801 further includes a rectangular parallelepiped first element body 812 that covers the first winding portion 811, and a pair of first outer electrodes 814 disposed at both ends of the first element body 812 in the longitudinal direction. The second inductor 802 further includes a rectangular parallelepiped second element body 822 that covers the second winding portion 821, and a pair of second outer electrodes 824 disposed at both ends of the second element body 822 in the longitudinal direction.

In the radio-frequency module 100 according to Embodiment 2, a winding axis V11 of the first winding portion 811 of the first inductor 801 does not intersect with the second inductor 802. The first inductor 801 is a vertically wound inductor and is mounted on the first main surface 91 of the mounting board 9 such that the winding axis V11 of the first winding portion 811 is parallel to the thickness direction D1 of the mounting board 9. The second inductor 802 is a horizontally wound inductor and is mounted on the first main surface 91 of the mounting board 9 such that the direction of the winding axis V12 of the second winding portion 821 is one direction orthogonal to the thickness direction D1 of the mounting board 9. Therefore, the direction of the winding axis V11 of the first winding portion 811 of the first inductor 801 and the direction of the winding axis V12 of the second winding portion 821 of the second inductor 802 are different from each other. In addition, in the examples of FIGS. 15A and 15B, the winding axis V11 of the first winding portion 811 of the first inductor 801 and the winding axis V12 of the second winding portion 821 of the second inductor 802 are orthogonal to each other. The fact that "the winding axis V11 of the first winding portion 811 of the first inductor 801 and the winding axis V12 of the second winding portion 821 of the second inductor 802 are orthogonal" is not limited to only the case of being strictly orthogonal, and the angle formed between the winding axis V11 of the first winding portion 811 of the first inductor 801 and the winding axis V12 of the second winding portion 821 of the second inductor 802 may be within a range of 85° or higher and 95° or lower.

Further, in the radio-frequency module 100 according to Embodiment 2, the two inductors L32 and L40 (refer to FIG. 1) used for simultaneous communication are adjacent to each other in plan view in the thickness direction D1 of the mounting board 9, and the longitudinal direction of the inductor L32 and the longitudinal direction of the inductor L40 are orthogonal to each other. One of the two inductors L32 and L40 may be used as the first inductor 801 and the other one may be used as the second inductor 802. In this case, in plan view in the thickness direction D1 of the mounting board 9, the longitudinal direction of the first element body 812 of the first inductor 801 and the longitudinal direction of the second element body 822 of the second inductor 802 are orthogonal to each other. The fact that "the longitudinal direction of the first element body 812 of the first inductor 801 and the longitudinal direction of the second element body 822 of the second inductor 802 are orthogonal to each other in plan view in the thickness direction D1 of the mounting board 9" is not limited to only the case of being strictly orthogonal, the angle between the longitudinal direction of the first element body 812 of the first inductor 801 and the longitudinal direction of the second element body 822 of the second inductor 802 may be within the range of 85° or more and 95° or less in plan view in the thickness direction D1 of the mounting board 9.

The radio-frequency module 100 according to Embodiment 2 includes the mounting board 9, the plurality of receive filters F0, the plurality of low-noise amplifiers A0, and the plurality of inductors L0. The mounting board 9 has the first main surface 91 and the second main surface 92 facing each other. The plurality of receive filters F0 are disposed on the mounting board 9. The plurality of receive filters F0 correspond to a plurality of communication bands. The plurality of low-noise amplifiers A0 are disposed on the mounting board 9. Each of the plurality of low-noise amplifiers A0 has an input terminal and an output terminal. The plurality of inductors L0 are disposed on the first main surface 91 of the mounting board 9. The plurality of inductors L0 are connected between the input terminals of the plurality of low-noise amplifiers A0 and the plurality of receive filters F0. The plurality of communication bands include two or more communication bands corresponding to a combination of communication bands capable of simultaneous communication. The plurality of inductors L0 include two or more inductors L0 connected to two or more receive filters F0 corresponding to two or more communication bands among the plurality of receive filters F0. The two or more inductors L0 include the first inductor 801 and the second inductor 802. The first inductor 801 has a first winding portion 811. The second inductor 802 has a second winding portion 821. The second inductor 802 is adjacent to the first inductor 801 in plan view in the thickness direction D1 of the mounting board 9. The winding axis V11 of the first winding portion 811 of the first inductor 801 does not intersect with the second inductor 802.

In the radio-frequency module 100 according to Embodiment 2, it is possible to suppress the deterioration in characteristics during simultaneous communication. More specifically, in the radio-frequency module 100 according to Embodiment 2, since the winding axis V11 of the first winding portion 811 of the first inductor 801 does not intersect with the second inductor 802, it is possible to suppress the electromagnetic coupling/electric field coupling between and the first inductor 801 and the second inductor 802 during simultaneous communication, and it is possible to suppress signal leakage between the first inductor 801 and the second inductor 802. Accordingly, in the radio-frequency module 100 according to Embodiment 2, it is possible to suppress the deterioration in characteristics during simultaneous communication.

Embodiment 3

Figure 16A:
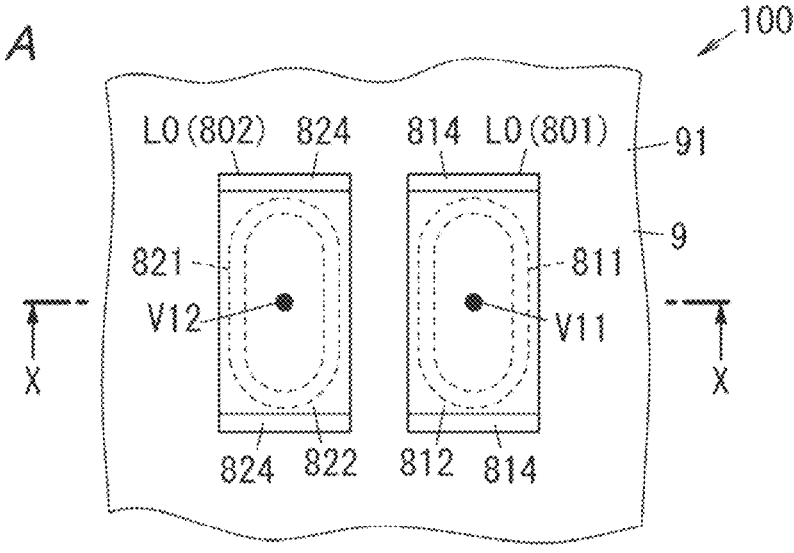
FIG. 16A is a plan view of main portions in a radio-frequency module according to Embodiment 3.
Figure 16B:
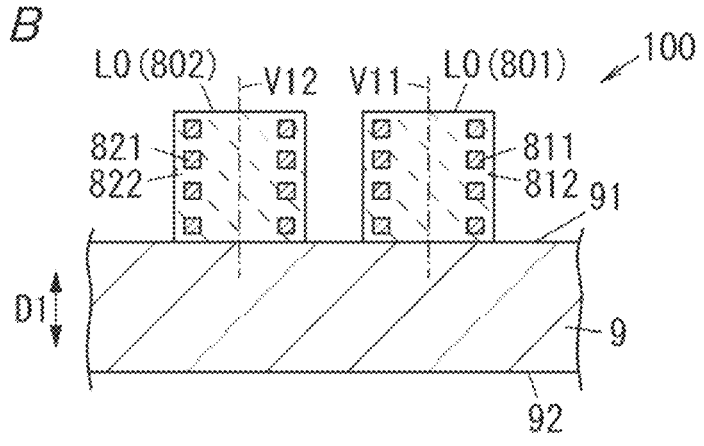
FIG. 16B is a cross-sectional view taken along line X-X in FIG. 16A.

As shown in FIGS. 16A and 16B, the radio-frequency module 100 according to Embodiment 3 is different from the radio-frequency module 100 (refer to FIGS. 1 and 2) according to Embodiment 1 in that the two inductors L0 used during simultaneous communication are adjacent to each other similar to the radio-frequency module 100 according to Embodiment 2. Since the circuit configuration and structure of the radio-frequency module 100 according to Embodiment 3 will be the same as the circuit configuration and structure of the radio-frequency module 100 according to Embodiment 1, the illustration and description thereof will be appropriately omitted. In the radio-frequency module 100 according to Embodiment 3, the position of the inductor L34 and the position of the inductor L40 are switched such that the two inductors L1 and L40 (refer to FIG. 1) used for simultaneous communication in the radio-frequency module 100 according Embodiment 1 are adjacent to each other. In FIGS. 16A and 16B, the two inductors L1 and L40 are shown as two inductors L0.

The two inductors L0 include the first inductor 801 and the second inductor 802. The first inductor 801 has a first winding portion 811. The second inductor 802 has a second winding portion 821. The second inductor 802 is adjacent to the first inductor 801 in plan view in the thickness direction D1 of the mounting board 9. The first inductor 801 is a vertically wound inductor and is mounted on the first main surface 91 of the mounting board 9 such that the winding axis V11 of the first winding portion 811 is parallel to the thickness direction D1 of the mounting board 9. In addition, the second inductor 802 is a vertically wound inductor and is mounted on the first main surface 91 of the mounting board 9 such that the direction of the winding axis V12 of the second winding portion 821 is parallel to the thickness direction D1 of the mounting board 9. Therefore, in the radio-frequency module 100 according to Embodiment 3, the winding axis V11 of the first winding portion 811 of the first inductor 801 does not intersect with the second inductor 802. The first inductor 801 further includes a rectangular parallelepiped first element body 812 that covers the first winding portion 811, and a pair of first outer electrodes 814 disposed at both ends of the first element body 812 in the longitudinal direction. The second inductor 802 further includes a rectangular parallelepiped second element body 822 that covers the second winding portion 821, and a pair of second outer electrodes 824 disposed at both ends of the second element body 822 in the longitudinal direction.

The radio-frequency module 100 according to Embodiment 3, it is possible to suppress the deterioration in characteristics during simultaneous communication. More specifically, in the radio-frequency module 100 according to Embodiment 3, since the winding axis V12 of the first winding portion 811 of the first inductor 801 does not intersect with the second inductor 802, it is possible to suppress the electromagnetic coupling/electric field coupling between and the first inductor 801 and the second inductor 802 during simultaneous communication, and it is possible to suppress signal leakage between the first inductor 801 and the second inductor 802. Accordingly, in the radio-frequency module 100 according to Embodiment 3, it is possible to suppress the deterioration in characteristics during simultaneous communication.

Figure 17:
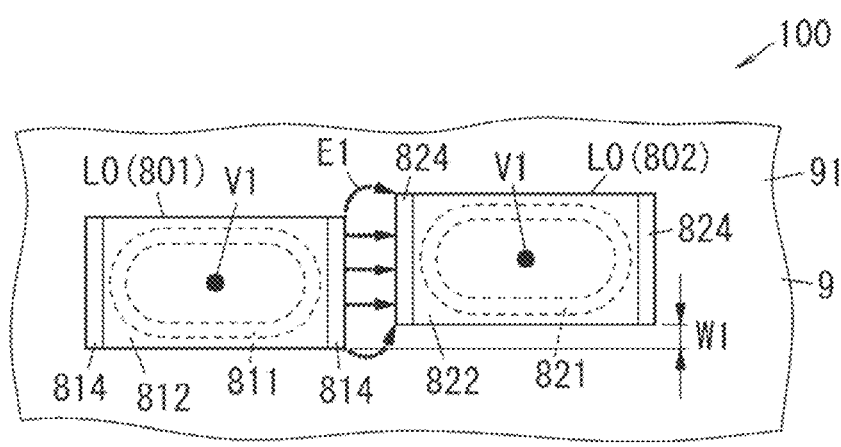
FIG. 17 is a plan view showing another disposition example of a first inductor and a second inductor in the above radio-frequency module.

Further, as shown in FIG. 17, even assuming the longitudinal direction of the first inductor 801 and the longitudinal direction of the second inductor 802 are disposed to be parallel to each other, by shifting the first inductor 801 and the second inductor 802 by a predetermined distance W1 in the short direction of the first inductor 801, it is possible to suppress the electric field coupling between the first outer electrode 814 of the first inductor 801 and the second outer electrode 824 of the second inductor 802. The predetermined distance W1 is, for example, a length that is one fifth or more of the length of the first inductor 801 in the short direction. In FIG. 17, an electric force line E1 is shown by a dotted line.

Embodiment 4

Figure 18:
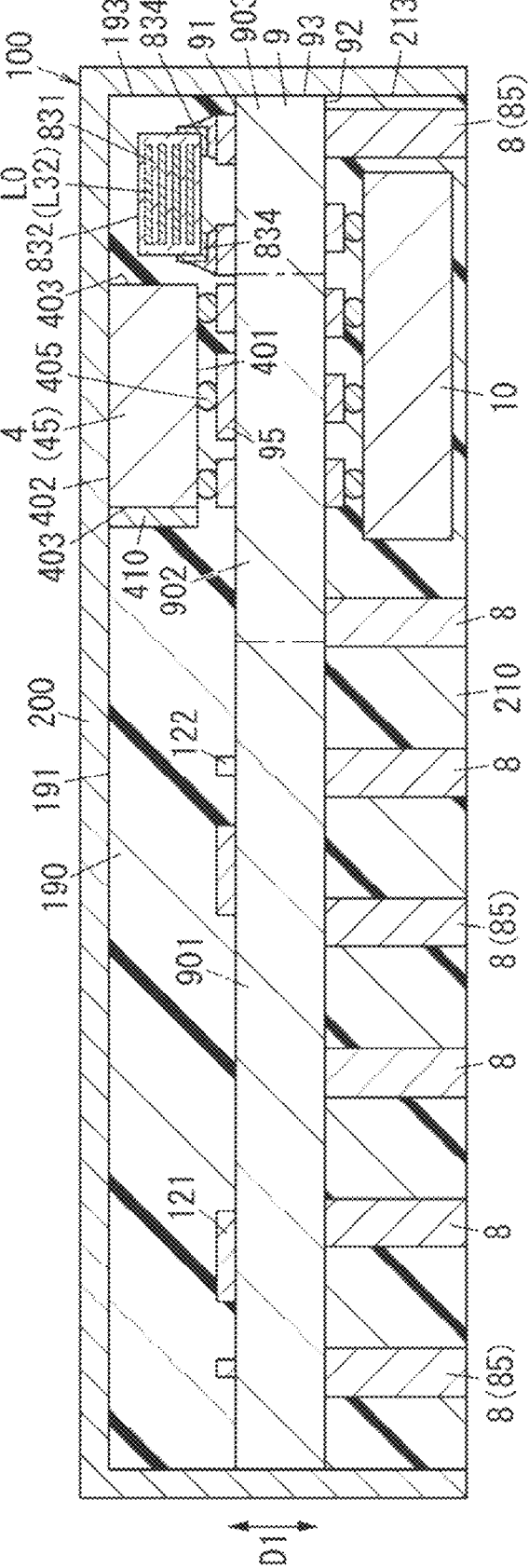
FIG. 18 is a cross-sectional view of a radio-frequency module according to Embodiment 4.

A radio-frequency module 100 according to Embodiment 4 will be described with reference to FIG. 18. Regarding the radio-frequency module 100 according to Embodiment 4, the same constituent elements as the radio-frequency module 100 according to Embodiment 1 will be given the same reference numerals, and the description thereof will be omitted.

The radio-frequency module 100 according to Embodiment 4 is different from the radio-frequency module 100 according to Embodiment 1 in that a side surface electrode 410 disposed on the side surface 403 on the first region 901 side of the mounting board 9 among the four side surfaces 403 of at least one receiving system electronic component 4 is further provided.

In the radio-frequency module 100 according to Embodiment 4, the side surface electrode 410 is in contact with the metal electrode layer 200. The material of the side surface electrode 410 is, for example, a metal or an alloy.

In the radio-frequency module 100 according to Embodiment 4, the side surface electrode 410 is provided, and thus it is possible to shield electromagnetic waves from transmitting system electronic components and the like disposed in the first region 901 of the mounting board 9, and it is possible to improve isolation. As a result, the radio-frequency module 100 according to Embodiment 4 can suppress the deterioration in the characteristics of the receive filter F0 included in the receiving system electronic component 4.

Embodiment 5

Figure 19:
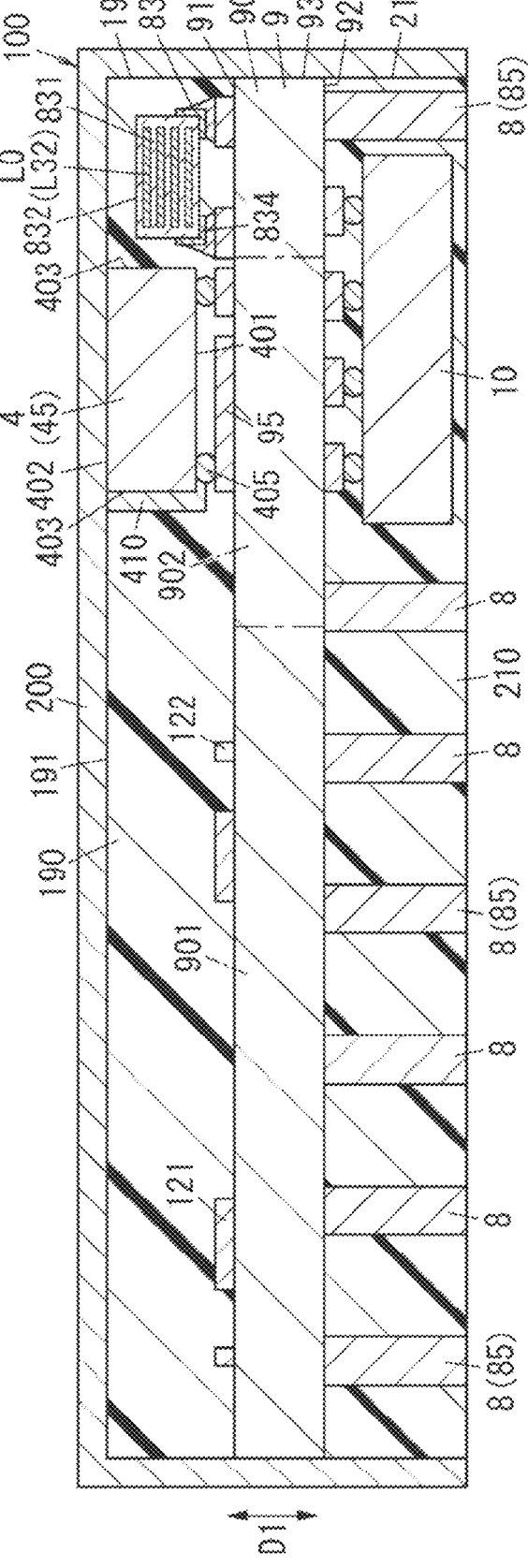
FIG. 19 is a cross-sectional view of a radio-frequency module according to Embodiment 5.

The radio-frequency module 100 according to Embodiment 5 will be described with reference to FIG. 19. Regarding the radio-frequency module 100 according to Embodiment 5, the same constituent elements as the radio-frequency module 100 according to Embodiment 4 will be given the same reference numerals, and the description thereof will be omitted.

In the radio-frequency module 100 according to Embodiment 5, the side surface electrode 410 is connected to the ground electrode 95 with the ground terminal 405 of the receiving system electronic component 4 interposed therebetween.

In the radio-frequency module 100 according to Embodiment 5, the side surface electrode 410 is connected not only to the metal electrode layer 200 but also to the ground electrode 95, and thus it is possible to further improve the isolation compared to the radio-frequency module 100 according to Embodiment 4.

In the radio-frequency module 100 according to Embodiment 5, the side surface electrode 410 is in contact with the metal electrode layer 200, similarly to the radio-frequency module 100 according to Embodiment 4, but it is not essential to be in contact with the metal electrode layer 200. Further, in the radio-frequency module 100 according to Embodiment 5, the main surface 402 of the receiving system electronic component 4 opposite to the mounting board 9 side is in contact with the metal electrode layer 200, but the present disclosure is not limited thereto, and the main surface 402 of the receiving system electronic component 4 opposite to the mounting board 9 side is covered with the first resin layer 190, and a part of the first resin layer 190 may be interposed between the main surface 402 and the metal electrode layer 200.

Embodiment 6

Figure 20:
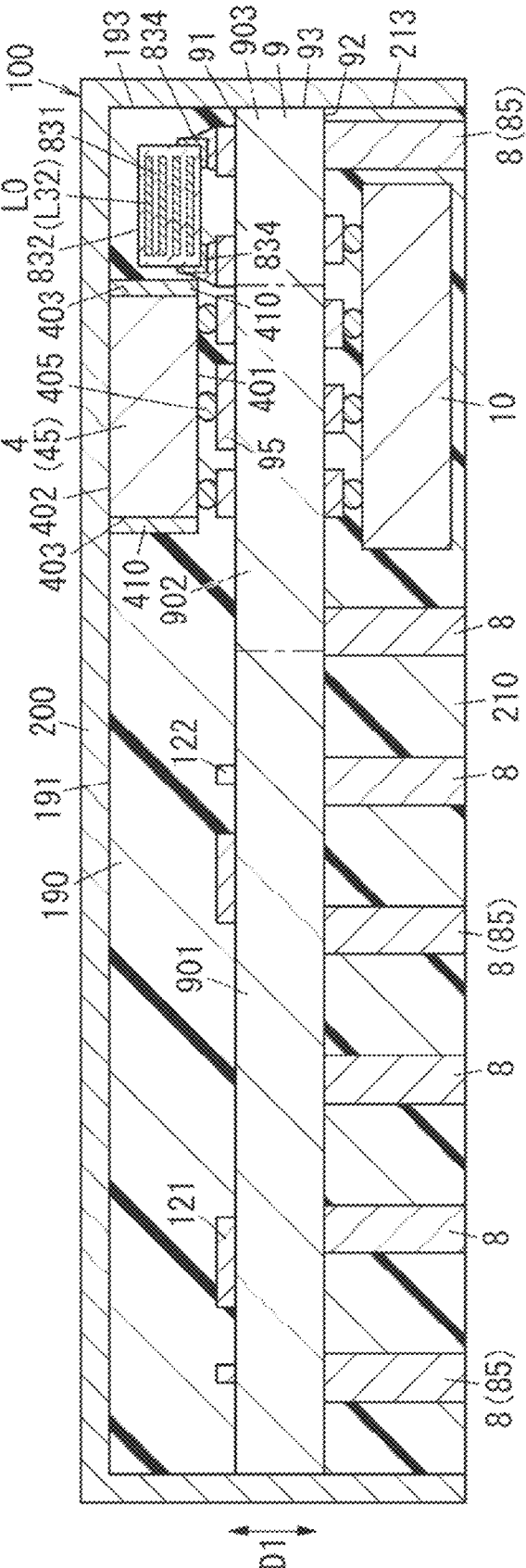
FIG. 20 is a cross-sectional view of a radio-frequency module according to Embodiment 6.

The radio-frequency module 100 according to Embodiment 6 will be described with reference to FIG. 20. Regarding the radio-frequency module 100 according to Embodiment 6, the same constituent elements as the radio-frequency module 100 according to Embodiment 4 will be given the same reference numerals, and the description thereof will be omitted.

The radio-frequency module 100 according to Embodiment 6 is different from the radio-frequency module 100 according to Embodiment 4 in that the side surface electrode 410 is disposed on both of the side surface 403 on the first region 901 side and the side surface 403 on the third region 903 side of the mounting board 9 among the four side surfaces 403 of at least one receiving system electronic component 4.

In the radio-frequency module 100 according to Embodiment 6, compared to the radio-frequency module 100 according to Embodiment 4, it is possible to suppress the coupling between at least one receiving system electronic component 4 and the inductor L0 adjacent to the at least one receiving system electronic component 4 among the plurality of inductors L0, the isolation can be improved, and it is possible to suppress the deterioration in the characteristics of the receive filter F0 included in the one receiving system electronic component 4.

Modification Example

Embodiments 1 to 6 or the like described above are merely one of various embodiments of the present disclosure. Various modifications to Embodiments 1 to 6 or the like described above are possible according to the design or the like as long as the object of the present disclosure can be achieved.

For example, each of the plurality of receive filters F0 is not limited to the case of being a surface acoustic wave filter, but may be a bulk acoustic wave filter. In the bulk acoustic wave filter, each of the plurality of acoustic wave resonators is a BAW resonator. The BAW resonator is, for example, a film bulk acoustic resonator (FBAR) or a solidly mounted resonator (SMR).

Further, each of the plurality of receive filters F0 may be, for example, an acoustic wave filter that uses a boundary acoustic wave, a plate wave, or the like.

Each of the plurality of external connection terminals 8 is not limited to the case of being a columnar electrode, and may be, for example, a ball-shaped bump. A material of the ball-shaped bump that configures each of the plurality of external connection terminals 8 is, for example, gold, copper, solder, and the like.

Further, the radio-frequency module 100 has a configuration in which a plurality of second circuit components are mounted on the first main surface 91 of the mounting board 9 rather than the second main surface 92, and need not include the second resin layer 210.

The circuit configuration of the radio-frequency module 100 is not limited to the example in FIG. 9 described above.

In addition, the radio-frequency module 100 is not limited to the transmission and reception module including the plurality of transmitting system electronic components and the plurality of receiving system electronic components 4, the receiving module may include a plurality of receiving system electronic components 4 out of the plurality of transmitting system electronic components and the plurality of receiving system electronic components 4.

Each of the plurality of input matching circuits is not limited to the case where one inductor L0 is provided, but may include, for example, a plurality of inductors and a plurality of capacitors.

Aspect

The following aspects are disclosed in the present specification.

The radio-frequency module (100) according to the first aspect includes the mounting board (9), the plurality of receive filters (F0), the plurality of low-noise amplifiers (A0), and the plurality of inductors (L0). The mounting board (9) has the first main surface (91) and the second main surface (92) facing each other. The plurality of receive filters (F0) are disposed on the mounting board (9). The plurality of receive filters (F0) correspond to a plurality of communication bands. The plurality of low-noise amplifiers (A0) are disposed on the mounting board (9). Each of the plurality of low-noise amplifiers (A0) has an input terminal and an output terminal. The plurality of inductors (L0) is disposed on the first main surface (91) of the mounting board (9). The plurality of inductors (L0) are connected to the input terminals of the plurality of low-noise amplifiers (A0). The plurality of communication bands include two or more communication bands included in a first combination of communication bands capable of simultaneous communication and two or more communication bands included in a second combination of communication bands capable of simultaneous communication. The plurality of inductors (L0) include two or more first inductors connected to two or more receive filters (F0) corresponding to two or more communication bands included in the first combination among the plurality of receive filters (F0), and two or more second inductors connected to the two or more receive filters (F0) corresponding to the two or more communication bands included in the second combination among the plurality of receive filters (F0). In plan view in the thickness direction (D1) of the mounting board (9), at least one second inductor among the two or more second inductors is positioned between two first inductors among the two or more first inductors.

According to the radio-frequency module (100) according to the first aspect, it is possible to suppress the deterioration in the characteristics during simultaneous communication.

The radio-frequency module (100) according to the second aspect includes the mounting board (9), the plurality of receive filters (F0), the plurality of low-noise amplifiers (A0), and the plurality of inductors (L0). The mounting board (9) has the first main surface (91) and the second main surface (92) facing each other. The plurality of receive filters (F0) are disposed on the mounting board (9). The plurality of receive filters (F0) correspond to a plurality of communication bands. The plurality of low-noise amplifiers (A0) are disposed on the mounting board (9). Each of the plurality of low-noise amplifiers (A0) has an input terminal and an output terminal. The plurality of inductors (L0) is disposed on the first main surface (91) of the mounting board (9). The plurality of inductors (L0) are connected to the input terminals of the plurality of low-noise amplifiers (A0). The plurality of communication bands include two or more communication bands corresponding to a combination of communication bands capable of simultaneous communication. The plurality of inductors (L0) include two or more inductors (L0) connected to two or more receive filters (F0) corresponding to two or more communication bands among the plurality of receive filters (F0). The two or more inductors (L0) include the first inductor (801) and the second inductor (802). The first inductor has a first winding portion (811). The second inductor (802) has a second winding portion (821). The second inductor (802) is adjacent to the first inductor (801) in plan view in the thickness direction (D1) of the mounting board (9). The winding axis (V11) of the first winding portion (811) of the first inductor (801) does not intersect with the second inductor (802).

According to the radio-frequency module (100) according to the second aspect, it is possible to suppress the deterioration in the characteristics during simultaneous communication.

In the radio-frequency module 100 according to the third aspect, in the second aspect, the first inductor (801) includes the rectangular parallelepiped first element body (812) that covers the first winding portion (811) and the pair of first outer electrodes (814) disposed at both ends of the first element body (812) in the longitudinal direction. The second inductor (802) further includes a rectangular parallelepiped second element body (822) that covers the second winding portion (821), and a pair of second outer electrodes (824) disposed at both ends of the second element body (822) in the longitudinal direction. In plan view in the thickness direction (D1) of the mounting board (9), the longitudinal direction of the first element body (812) of the first inductor (801) and the longitudinal direction of the second element body (822) of the second inductor (802) are orthogonal to each other.

In the radio-frequency module (100) according to the third aspect, it is possible to suppress the electromagnetic coupling/electric field coupling between the first inductor (801) and the second inductor (802).

In the radio-frequency module (100) according to the fourth aspect, in the second or third aspect, the direction of the winding axis (V11) of the first winding portion (811) of the first inductor (801) and the direction of the winding axis (V12) of the second winding portion (821) of the second inductor (802) are different from each other.

In the radio-frequency module (100) according to the fourth aspect, it is possible to suppress the electromagnetic coupling between the first inductor (801) and the second inductor (802).

In the radio-frequency module (100) according to the fifth aspect, in the second or third aspect, the winding axis (V11) of the first winding portion (811) of the first inductor (801) and the winding axis (V12) of the second winding portion (821) of the second inductor (802) are orthogonal to each other.

In the radio-frequency module (100) according to the fifth aspect, it is possible to suppress the electromagnetic coupling between the first inductor (801) and the second inductor (802).

In the radio-frequency module (100) according to the sixth aspect, in any one of the first to fifth aspects, the plurality of receiving system electronic components (4) and the plurality of transmitting system electronic components (the amplifier 111 of the power amplifier 110A, the amplifier 112 of the power amplifier 110B) are further provided. The plurality of receiving system electronic components (4) is disposed on the first main surface (91) of the mounting board (9). The plurality of receiving system electronic components (4) include at least one receive filter (F0) in the plurality of receive filters (F0) connected to the plurality of inductors (L0). The plurality of transmitting system electronic components are disposed on the first main surface (91) of the mounting board (9). The mounting board (9) includes the first region (901) that overlaps the plurality of transmitting system electronic components in plan view in the thickness direction (D1) of the mounting board (9), the second region (902) that overlaps the plurality of receiving system electronic components (4) in plan view in the thickness direction (D1) of the mounting board (9), and the third region (903) that overlaps the plurality of inductors (L0) in plan view in the thickness direction (D1) of the mounting board (9). There is the second region (902) between the first region (901) and the third region (903).

According to the radio-frequency module (100) according to the sixth aspect, it is easy to lengthen the distance between the plurality of inductors (L0) and the plurality of transmitting system electronic components.

In the radio-frequency module (100) according to a seventh aspect, in the sixth aspect, the ground electrode (95) disposed on the first main surface (91) of the mounting board (9) is further provided. The ground electrode (95) overlaps a part of at least one receiving system electronic component (4) among the plurality of receiving system electronic components (4) in plan view in the thickness direction (D1) of the mounting board (9), and is connected to at least one receiving system electronic component (4).

In the radio-frequency module (100) according to the seventh aspect, it is possible to suppress the transmission signal passing through the transmitting system electronic component from leaking to the plurality of inductors (L0).

In the radio-frequency module (100) according to the eighth aspect, in the seventh aspect, the ground electrode (95) is positioned along the boundary between the first region (901) and the second region (902) in plan view in the thickness direction (D1) of the mounting board (9).

In the radio-frequency module (100) according to the eighth aspect, it is possible to further suppress leakage of transmission signals that pass through the transmitting system electronic components and the like disposed in the first region (901) of the mounting board (9) to the plurality of inductors (L0) disposed in the third region (903).

In the radio-frequency module (100) according to the ninth aspect, in the seventh or eighth aspect, at least one receiving system electronic component (4) further includes the surface (401) on the mounting board (9) side, the main surface (402) opposite to the mounting board (9) side, at least four side surfaces (403), and the ground terminal (405) disposed on the surface (401) on the mounting board (9) side and connected to the mounting board (9). The radio-frequency module (100) further includes a side surface electrode (410) disposed on the side surface (403) on the first region (901) side among the four side surfaces (403) of the at least one receiving system electronic component (4). The side surface electrode (410) is connected to the ground electrode (95) with the ground terminal (405) interposed therebetween.

In the radio-frequency module (100) according to the ninth aspect, it is possible to suppress the deterioration in the characteristics of the at least one receiving system electronic component (4).

In the radio-frequency module (100) according to a tenth aspect, in any one of the first to fifth aspects, the plurality of receiving system electronic components (4), the resin layer (190), and the metal electrode layer (200) are further provided. The plurality of receiving system electronic components (4) is disposed on the first main surface (91) of the mounting board (9). Each of the plurality of receiving system electronic components (4) has the main surface (402) opposite to the mounting board (9) side and at least four side surfaces (403). The resin layer (190) covers some of four side surfaces (403) of each of the plurality of receiving system electronic components (4). The metal electrode layer (200) covers the main surface (402) of at least one electronic receiving system electronic component (4) in the plurality of receiving system electronic components (4), and the main surface (191) opposite to the mounting board (9) side of the resin layer (190). The plurality of receiving system electronic components (4) includes at least one receive filter (F0) among the plurality of receive filters (F0). The radio-frequency module (100) further includes the side surface electrode (410) disposed on at least one of the side surface (403) on the first region (901) side and the side surface (403) on the third region (903) among the four side surfaces (403) of the at least one receiving system electronic component (4). The side surface electrode (410) is in contact with the metal electrode layer (200).

In the radio-frequency module (100) according to the tenth aspect, it is possible to suppress the deterioration in the characteristics of the at least one receiving system electronic component (4).

In the radio-frequency module (100) according to the eleventh aspect, in any one of the first to tenth aspects, the plurality of low-noise amplifiers (A0) are disposed on the second main surface (92) of the mounting board (9).

In the radio-frequency module (100) according to the twelfth aspect, in the first aspect, the first combination includes two or more communication bands among Band 1, Band 3, Band 40, Band 32, and Band 7 of the 3GPP LTE standard. The second combination includes two or more communication bands among Band 34, Band 39, and Band 41 of the 3GPP LTE standard.

In the radio-frequency module (100) according to the thirteenth aspect, in the first aspect, the first combination includes two or more communication bands among Band 1, Band 3, Band 40, Band 32, and Band 41 of the 3GPP LTE standard. The second combination includes two or more communication bands among Band 34, Band 39, and Band 41 of the 3GPP LTE standard.

In the radio-frequency module (100) according to the fourteenth aspect, in the first aspect, the first combination includes two or more communication bands among Band 25, Band 66, Band 30, and Band 7 of the 3GPP LTE standard. The second combination includes two or more communication bands among Band 34, Band 39, and Band 41 of the 3GPP LTE standard.

In the radio-frequency module (100) according to the fifteenth aspect, in the first aspect, the first combination includes two or more communication bands among Band 25, Band 66, Band 30, and Band 41 of the 3GPP LTE standard. The second combination includes two or more communication bands among Band 34, Band 39, and Band 41 of the 3GPP LTE standard.

The communication device (300) according to the sixteenth aspect includes the radio-frequency module (100) according to any one of the first to fifteenth aspects, and the signal processing circuit (301). The signal processing circuit (301) is connected to the radio-frequency module (100).

According to the sixteenth aspect, the communication device (300) can suppress deterioration in characteristics during the simultaneous communication.

REFERENCE SIGNS LIST 2, 2A, 2B, 2C, 2D First switch
20 Common terminal
21 to 24 Selection terminal
3, 3A, 3B, 3C, 3D Second switch
30 Common terminal
31 to 34 Selection terminal
4 Receiving system electronic component
41 to 46 Receiving system electronic component
401 Surface
402 Main surface
403 Side surface
405 Ground terminal
410 Side surface electrode
5 First switch circuit
5A, 5B, 5C Common terminal
50 to 59 Selection terminal
6 Second switch circuit
60 Common terminal
61, 62 Selection terminal
7 Switch
70 IC chip
8 External connection terminal
81A, 81B, 81C Antenna terminal
83A, 83B Signal input terminal
82A, 82B, 82C, 82D Signal output terminal
84 Control terminal
85 Ground terminal
9 Mounting board
91 First main surface
92 Second main surface
93 Outer peripheral surface
95 Ground electrode
901 First region 902 Second region
903 Third region
10 IC chip
14 Switch
140 Common terminal
141 Selection terminal
142 Selection terminal
17 Switch
171A First terminal
171B First terminal
172A Second terminal
172B Second terminal
18 Controller
100 Radio-frequency module
110A, 110B Power amplifier
111, 112 Amplifier
121, 122 Transformer
131, 132 Output matching circuit
150, 151, 152, 153 Transmission filter
161, 162, 163 Matching circuit
190 Resin layer (first resin layer)
191 Main surface
193 Outer peripheral surface
200 Metal electrode layer
210 Second resin layer
213 Outer peripheral surface
300 Communication device
301 Signal processing circuit
302 RF signal processing circuit
303 Baseband signal processing circuit
801 First inductor
811 First winding portion
812 First element body
814 First outer electrode
821 Second winding portion
822 Second element body
824 Second outer electrode
831 Winding portion
832 Element body
834 Outer electrode
AN1, AN2, AN3 Antenna
A0, A1, A3, A7, A11, A25, A30, A32, A34, A39, A40, A41, A53, A66 Low-noise amplifier
D1 Thickness direction
L0, L1, L3, L7, L11, L25, L30, L32, L34, L39, L40, L41, L53, L66 Inductor
F0, F1, F3, F7, F11, F25, F30, F32, F34, F39, F40, F41, F53, F66 Receive filter
V1, V11, V12 Winding axis
The invention claimed is:
1. A radio-frequency module comprising:
a mounting board including a first main surface and a second main surface facing each other;
a plurality of receive filters disposed on the mounting board and corresponding to a plurality of communication bands;
a plurality of low-noise amplifiers disposed on the mounting board and having an input terminal and an output terminal; and
a plurality of inductors disposed on the first main surface of the mounting board and connected between the input terminal of the plurality of low-noise amplifiers and the plurality of receive filters, wherein
the plurality of communication bands include
two or more communication bands included in a first combination of the communication bands capable of simultaneous communication, and two or more communication bands included in a second combination of the communication bands capable of simultaneous communication, the plurality of inductors include two or more first inductors connected to two or more receive filters corresponding to the two or more communication bands included in the first combination among the plurality of receive filters, and two or more second inductors connected to two or more receive filters corresponding to the two or more communication bands included in the second combination among the plurality of receive filters, and at least one second inductor among the two or more second inductors is positioned between two first inductors among the two or more first inductors in plan view in a thickness direction of the mounting board.

2. A radio-frequency module comprising:

a mounting board including a first main surface and a second main surface facing each other;

a plurality of receive filters disposed on the mounting board and corresponding to a plurality of communication bands;

a plurality of low-noise amplifiers disposed on the mounting board and having an input terminal and an output terminal; and a plurality of inductors disposed on the first main surface of the mounting board and connected between the input terminal of the plurality of low-noise amplifiers and the plurality of receive filters, wherein the plurality of communication bands include two or more communication bands corresponding to combination of the communication bands capable of simultaneous communication, the plurality of inductors include two or more inductors connected to two or more receive filters corresponding to the two or more communication bands among the plurality of receive filters, the two or more inductors include a first inductor having a first winding portion, and a second inductor having a second winding portion and adjacent to the first inductor in plan view in a thickness direction of the mounting board, and a winding axis of the first winding portion of the first inductor does not intersect with the second inductor.

3. The radio-frequency module according to claim 2, wherein the first inductor further includes a rectangular parallelepiped first element body covering the first winding portion, and a pair of first outer electrodes disposed at both ends of the first element body in a longitudinal direction, the second inductor further includes a rectangular parallelepiped second element body covering the second winding portion, and a pair of second outer electrodes disposed at both ends of the second element body in a longitudinal direction, and the longitudinal direction of the first element body of the first inductor and the longitudinal direction of the second element body of the second inductor are orthogonal to each other in plan view in the thickness direction of the mounting board.

4. The radio-frequency module according to claim 3, wherein a direction of the winding axis of the first winding portion of the first inductor and a direction of a winding axis of the second winding portion of the second inductor are different from each other.

5. The radio-frequency module according to claim 3, wherein the winding axis of the first winding portion of the first inductor and a winding axis of the second winding portion of the second inductor are orthogonal to each other.

6. The radio-frequency module according to claim 5, comprising system electronic components disposed on the first main surface of the mounting board and including at least one receive filter among the plurality of receive filters connected to the plurality of inductors; and a plurality of transmitting system electronic components disposed on the first main surface of the mounting board, wherein the mounting board includes a first region overlapping the plurality of transmitting system electronic components in plan view in the thickness direction of the mounting board, a second region overlapping the plurality of receiving system electronic components in plan view in the thickness direction of the mounting board, and a third region overlapping the plurality of inductors in plan view in the thickness direction of the mounting board, and the second region is between the first region and the third region.

7. The radio-frequency module according to claim 6, further comprising:

a ground electrode disposed on the first main surface of the mounting board, wherein the ground electrode overlaps a part of at least one receiving system electronic component among the plurality of receiving system electronic components in plan view in the thickness direction of the mounting board, and is connected to the at least one receiving system electronic component.

8. The radio-frequency module according to claim 7, wherein the ground electrode is positioned along a boundary between the first region and the second region in plan view in the thickness direction of the mounting board.

9. The radio-frequency module according to claim 8, wherein the at least one receiving system electronic component includes a surface on a mounting board side, a main surface opposite to the mounting board side, at least four side surfaces, and a ground terminal disposed on the surface on the mounting board side and connected to the mounting board, the radio-frequency module further comprises a side surface electrode disposed on a side surface on a first region side among the four side surfaces in the at least one receiving system electronic component, and the side surface electrode is connected to the ground electrode by using the ground terminal.

10. The radio-frequency module according to claim 5, further comprising:

a plurality of receiving system electronic components disposed on the first main surface of the mounting board, and each having a main surface opposite to a mounting board side and at least four side surfaces;

a resin layer covering a part of the four side surfaces of each of the plurality of receiving system electronic components; and a metal electrode layer covering the main surface of at least one receiving system electronic component among the plurality of receiving system electronic components and a main surface opposite to the mounting board side in the resin layer, wherein the plurality of receiving system electronic components include at least one receive filter among the plurality of receive filters, the radio-frequency module further comprises a side surface electrode disposed on at least one of a side surface on a first region side and a side surface on a third region side among the four side surfaces of the at least one receiving system electronic component, and the side surface electrode is in contact with the metal electrode layer.

11. The radio-frequency module according to claim 10, wherein the plurality of low-noise amplifiers are disposed on the second main surface of the mounting board.

12. The radio-frequency module according to claim 1, wherein the first combination includes two or more communication bands among Band 1, Band 3, Band 40, Band 32, and Band 7 of a 3GPP LTE standard, and the second combination includes two or more communication bands among Band 34, Band 39, and Band 41 of the 3GPP LTE standard.

13. The radio-frequency module according to claim 1, wherein the first combination includes two or more communication bands among Band 1, Band 3, Band 40, Band 32, and Band 41 of a 3GPP LTE standard, and the second combination includes two or more communication bands among Band 34, Band 39, and Band 41 of the 3GPP LTE standard.

14. The radio-frequency module according to claim 1, wherein the first combination includes two or more communication bands among Band 25, Band 66, Band 30, and Band 7 of a 3GPP LTE standard, and the second combination includes two or more communication bands among Band 34, Band 39, and Band 41 of the 3GPP LTE standard.

15. The radio-frequency module according to claim 1, wherein the first combination includes two or more communication bands among Band 25, Band 66, Band 30, and Band 41 of a 3GPP LTE standard, and the second combination includes two or more communication bands among Band 34, Band 39, and Band 41 of the 3GPP LTE standard.

16. A communication device comprising:

the radio-frequency module according to claim 1; and a signal processing circuit connected to the radio-frequency module.

17. The radio-frequency module according to claim 2, wherein a direction of the winding axis of the first winding portion of the first inductor and a direction of a winding axis of the second winding portion of the second inductor are different from each other.

18. The radio-frequency module according to claim 2, wherein the winding axis of the first winding portion of the first inductor and a winding axis of the second winding portion of the second inductor are orthogonal to each other.

19. The radio-frequency module according to claim 7, wherein the at least one receiving system electronic component includes a surface on a mounting board side, a main surface opposite to the mounting board side, at least four side surfaces, and a ground terminal disposed on the surface on the mounting board side and connected to the mounting board, the radio-frequency module further comprises a side surface electrode disposed on a side surface on a first region side among the four side surfaces in the at least one receiving system electronic component, and the side surface electrode is connected to the ground electrode by using the ground terminal.

20. The radio-frequency module according to claim 4, further comprising:

a plurality of receiving system electronic components disposed on the first main surface of the mounting board, and each having a main surface opposite to a mounting board side and at least four side surfaces;

a resin layer covering a part of the four side surfaces of each of the plurality of receiving system electronic components; and a metal electrode layer covering the main surface of at least one receiving system electronic component among the plurality of receiving system electronic components and a main surface opposite to the mounting board side in the resin layer, wherein the plurality of receiving system electronic components include at least one receive filter among the plurality of receive filters, the radio-frequency module further comprises a side surface electrode disposed on at least one of a side surface on a first region side and a side surface on a third region side among the four side surfaces of the at least one receiving system electronic component, and the side surface electrode is in contact with the metal electrode layer.

* * * * *